United States Patent
Shin et al.

(10) Patent No.: US 11,297,439 B2
(45) Date of Patent: Apr. 5, 2022

(54) DISPLAY APPARATUS INCLUDING FLEXIBLE VIBRATION MODULE AND METHOD OF MANUFACTURING THE FLEXIBLE VIBRATION MODULE

(71) Applicant: LG Display Co., Ltd., Seoul (KR)

(72) Inventors: Sung Eui Shin, Paju-si (KR); Taeheon Kim, Paju-si (KR); Kyungyeol Ryu, Paju-si (KR); YongGyoon Jang, Paju-si (KR); Chiwan Kim, Paju-si (KR); YongWoo Lee, Paju-si (KR); YuSeon Kho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/013,035

(22) Filed: Sep. 4, 2020

(65) Prior Publication Data

US 2020/0404427 A1 Dec. 24, 2020

Related U.S. Application Data

(63) Continuation of application No. 16/443,454, filed on Jun. 17, 2019, now Pat. No. 10,805,736.

(30) Foreign Application Priority Data

Aug. 20, 2018 (KR) .......................... 10-2018-0096924
Mar. 29, 2019 (KR) .......................... 10-2019-0037499

(51) Int. Cl.
*H04R 17/00* (2006.01)
*H04R 1/02* (2006.01)
(Continued)

(52) U.S. Cl.
CPC ............. *H04R 17/00* (2013.01); *H04R 1/028* (2013.01); *H04R 7/045* (2013.01); *G06F 1/1652* (2013.01); *H04R 2499/15* (2013.01)

(58) Field of Classification Search
CPC ........ H04R 17/00; H04R 1/028; H04R 7/045; H04R 2499/15; G06F 1/1652;
(Continued)

(56) References Cited

U.S. PATENT DOCUMENTS 6,629,341 B2 10/2003 Wilkie et al.
7,197,798 B2 4/2007 Wilkie et al.
(Continued)

FOREIGN PATENT DOCUMENTS

JP 2009267528 A * 11/2009
JP 2014-212307 A 11/2014
(Continued)

*Primary Examiner* — Yogeshkumar Patel
(74) *Attorney, Agent, or Firm* — Morgan, Lewis & Bockius LLP

(57) ABSTRACT

A display apparatus including a flexible vibration module and a method of manufacturing the flexible vibration module are provided. A display apparatus includes: a display panel configured to display an image, and a flexible vibration module on a rear surface of the display panel, the flexible vibration module configured to vibrate the display panel, the flexible vibration module including: a plurality of first portions having a piezoelectric characteristic, and a plurality of second portions respectively between pairs of the plurality of first portions, the plurality of second portions having flexibility.

25 Claims, 18 Drawing Sheets

(51) Int. Cl.
*H04R 7/04* (2006.01)
*G06F 1/16* (2006.01)

(58) Field of Classification Search
CPC ... G06F 3/016; B06B 1/0607; H01L 41/0986; H01L 41/083; H01L 41/27
See application file for complete search history.

(56) References Cited

U.S. PATENT DOCUMENTS

| | | | |
|---|---|---|---|
| 8,279,712 B2 | 10/2012 | Korbler et al. | |
| 8,712,079 B2 | 4/2014 | Kim et al. | |
| 8,873,776 B2 | 10/2014 | Kim et al. | |
| 9,029,459 B2 | 5/2015 | Kobayashi et al. | |
| 9,621,997 B2 | 4/2017 | Miyoshi et al. | |
| 9,876,161 B2 | 1/2018 | Lee et al. | |
| 9,986,341 B2 | 5/2018 | Miyoshi | |
| 2003/0056351 A1 | 3/2003 | Wilkie et al. | |
| 2009/0231959 A1 | 9/2009 | Korbler et al. | |
| 2011/0043454 A1 | 2/2011 | Modarres et al. | |
| 2011/0217519 A1* | 9/2011 | Sakashita | B32B 3/10 428/172 |
| 2011/0261021 A1 | 10/2011 | Modarres et al. | |
| 2012/0148073 A1 | 6/2012 | Kim et al. | |
| 2013/0167881 A1* | 7/2013 | Korbler | B06B 1/0629 134/34 |
| 2014/0159542 A1 | 6/2014 | Lee et al. | |
| 2014/0210309 A1* | 7/2014 | Miyoshi | G10H 3/146 310/313 A |
| 2016/0313793 A1 | 10/2016 | Hong et al. | |
| 2017/0263848 A1* | 9/2017 | Kim | H01L 41/193 |
| 2019/0045287 A1* | 2/2019 | Lee | H04R 7/045 |

FOREIGN PATENT DOCUMENTS

| | | | | |
|---|---|---|---|---|
| JP | 2015-195540 A | | 11/2015 | |
| JP | 2016219804 A | * | 12/2016 | |
| KR | 10-0824745 B1 | | 4/2008 | |
| KR | 10-2010-0073075 A | | 7/2010 | |
| KR | 10-2010-0098525 B1 | | 9/2010 | |
| KR | 10-2011-0027647 A | | 3/2011 | |
| KR | 10-2012-0013273 A | | 2/2012 | |
| KR | 10-2014-0073201 A | | 6/2014 | |
| KR | 10-1578806 B1 | | 12/2015 | |
| KR | 10-2016-0015348 A | | 2/2016 | |
| KR | 10-2019-0014794 A | | 2/2019 | |
| KR | 20190014794 A | * | 2/2019 | ............... H04R 1/26 |

* cited by examiner

DISPLAY APPARATUS INCLUDING FLEXIBLE VIBRATION MODULE AND METHOD OF MANUFACTURING THE FLEXIBLE VIBRATION MODULE

CROSS-REFERENCE TO RELATED APPLICATION(S)

This application is a Continuation Application of U.S. patent application Ser. No. 16/443,454, filed on Jun. 17, 2019, which claims the benefit of and priority to Korean Patent Applications No. 10-2019-0037499, filed on Mar. 29, 2019; and No. 10-2018-0096924, filed on Aug. 20, 2018; the entirety of each which is hereby incorporated by reference.

BACKGROUND

1. Technical Field

The present disclosure relates to a display apparatus, and more particularly, to a display apparatus including a flexible vibration module and a method of manufacturing the flexible vibration module.

2. Discussion of the Related Art

Generally, in display apparatuses, a display panel displays an image, and a separate speaker should be installed for providing a sound. When a speaker is in a display apparatus, the speaker occupies a space; due to this, the design and spatial disposition of the display apparatus are limited.

A speaker applied to display apparatuses may be, for example, an actuator, including a magnet and a coil. However, when the actuator is applied to the display apparatuses, a thickness thereof is large. Piezoelectric elements that enable thinness to be implemented are attracting much attention.

Because the piezoelectric elements are fragile, the piezoelectric elements are easily damaged by an external impact. Thus, the reliability of sound reproduction is low.

SUMMARY

Accordingly, the present disclosure is directed to a display apparatus including a flexible vibration module and a method of manufacturing the flexible vibration module that substantially obviate one or more of the issues due to limitations and disadvantages of the related art.

An aspect of the present disclosure is to provide a display apparatus including a flexible vibration module that is disposed on a rear surface of a display panel of the display apparatus, vibrates the display panel to generate a sound, and has a good sound pressure characteristic and good sound localization.

Another aspect of the present disclosure is to provide a display apparatus including a flexible vibration module that is flexible. Thus, may be applied to various application fields, such as curved display apparatuses, rollable display apparatuses, bendable display apparatuses, and flexible display apparatuses.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, and a flexible vibration module on a rear surface of the display panel, the flexible vibration module configured to vibrate the display panel, the flexible vibration module including: a plurality of first portions having a piezoelectric characteristic, and a plurality of second portions respectively between pairs of the plurality of first portions, the plurality of second portions having flexibility.

In another aspect, there is provided a display apparatus, including: a flexible display panel capable of being wound in a spiral shape, unwound, or at a certain curvature radius, the flexible display panel including a display area configured to display an image, and a flexible vibration module on a rear surface of the flexible display panel to correspond to the display area and bent based on unwinding or winding of the flexible display panel or bent based on a curvature of the flexible display panel, the flexible vibration module including: a plurality of vibration portions, and a plurality of elastic portions respectively between pairs of the plurality of vibration portions, the plurality of elastic portions having flexibility.

In another aspect, there is provided a method of manufacturing a flexible vibration module, the method including: manufacturing a piezoelectric composite including a plurality of inorganic material portions and a plurality of organic material portions connected between the plurality of inorganic material portions, based on an inorganic material mother substrate having a piezoelectric characteristic and an organic material having flexibility, forming a first electrode layer on a first surface of the piezoelectric composite and a second electrode layer on a second surface of the piezoelectric composite, applying a voltage to the first electrode layer and the second electrode layer to form polarization of each of the plurality of inorganic material portions in a temperature atmosphere, and forming a protection film on each of the first electrode layer and the second electrode layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
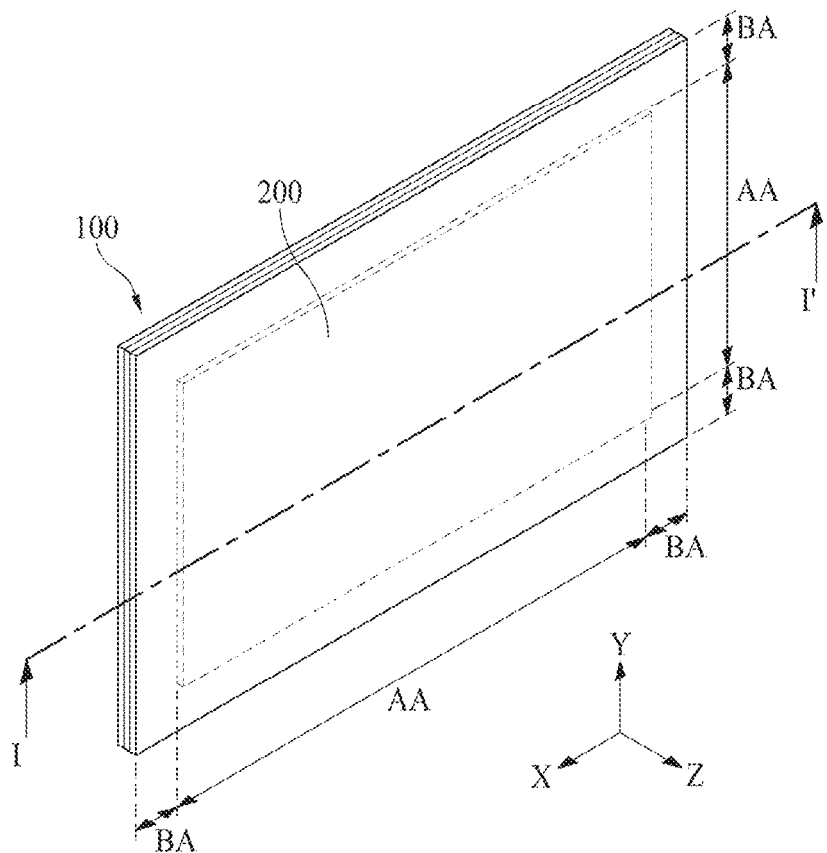
FIG. 1 is a perspective view of a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, a display apparatus according to an embodiment of the present disclosure will be described in detail with reference to the accompanying drawings. In adding reference numerals to elements of each of the drawings, although the same elements are illustrated in other drawings, like reference numerals may refer to like elements.

For a display apparatus to provide a sound, a speaker may be implemented in a film type. A film-type vibration module may be manufactured to have a large area, and may be applied to a display apparatus having a large area. However, because the film type vibration module is low in a piezoelectric characteristic, it may be difficult to apply the film-type vibration module to a large area due to a low vibration. When ceramic is used for enhancing a piezoelectric characteristic, the film type vibration module may weak in durability, and a size of ceramic may be limited. When a vibration module including a piezoelectric composite including piezoelectric ceramic is applied to a display apparatus, because the piezoelectric composite vibrates in a horizontal direction with respect to a left-right direction (for example, a horizontal direction with respect to a left-right direction of the display apparatus), it may unable to sufficiently vibrate the display apparatus in a vertical (e.g., front-to-rear) direction. Thus, it may difficult to apply the vibration module to the display apparatus, and it may unable to output a desired sound to a forward region in front of the display apparatus. When a film-type piezoelectric is applied to a display apparatus, a sound pressure characteristic thereof may be lower than that of general speakers, such as exciters. When a stacked film type piezoelectric, in which a film-type piezoelectric is configured with a multilayer to improve a sound pressure, is applied to a display apparatus, power consumption may increase.

Therefore, the inventors have performed various experiments for implementing a vibration module for enhancing a piezoelectric characteristic, stiffness, and flexibility. For example, the inventors have recognized that, when a vibration module is formed of a composite including a filler having a high dielectric constant, a piezoelectric characteristic is low, and thus, it is unable to realize a desired sound. Through the various experiments, the inventors have recognized that a vibration module should be formed of piezoelectric ceramic to have a piezoelectric characteristic, and should be formed of an organic material to secure stiffness and flexibility. Through the various experiments, the inventors have recognized that a vibration module should be formed of piezoelectric ceramic to have a piezoelectric characteristic, and should be formed of a material, such as a polymer, to solve fragility of piezoelectric ceramic. The inventors have recognized that, when a vibration module is configured so that a material, such as a polymer, is included in a piezoelectric ceramic composite, the vibration module has flexibility. Therefore, the inventors have invented a display apparatus including a vibration module having a new structure for enhancing a piezoelectric characteristic, stiffness, and flexibility. This will be described below.

According to an embodiment of the present disclosure, a flexible vibration module may be manufactured to have a good sound pressure characteristic, a good sound localization characteristic, and a flexible characteristic, and may be invulnerable to an external impact. A display apparatus may include the flexible vibration module, thereby enhancing reliability and consumer satisfaction. The display apparatus may be one of: a curved, a rollable, a bendable, and a flexible display apparatus. According to an embodiment of the present disclosure, a flexible vibration module may have various shapes, such as a two-dimensional (2D) shape and a three-dimensional (3D) shape, based on flexibility, and a method of manufacturing the flexible vibration module may be provided.

Figure 2:
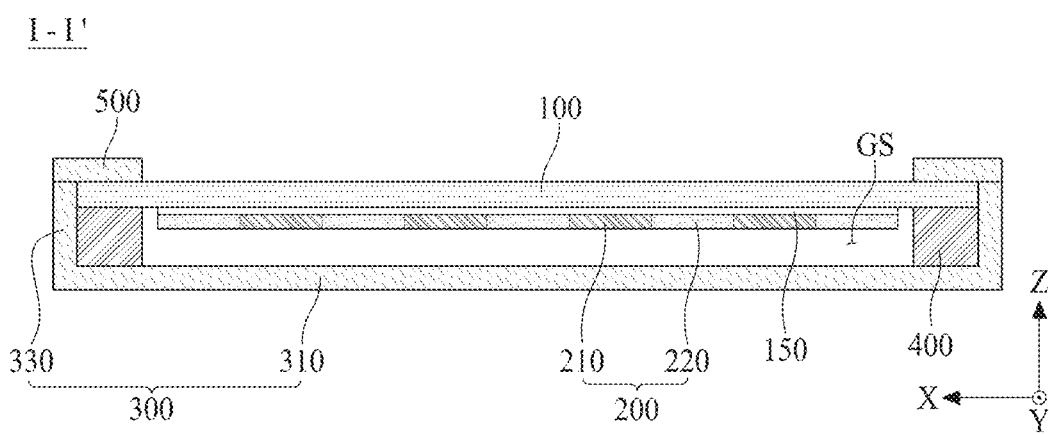
FIG. 2 is a cross-sectional view taken along line I-I' illustrated in FIG. 1.

FIG. 1 is a perspective view of a display apparatus according to an embodiment of the present disclosure. FIG. 2 is a cross-sectional view taken along line I-I' illustrated in FIG. 1.

With reference to FIGS. 1 and 2, a display apparatus according to an embodiment of the present disclosure may include a display panel 100 and a flexible vibration module 200 on a rear surface of the display panel 100. A "rear surface" may denote a surface of the display panel opposite to a front surface of the display panel including the display area for displaying an image. The display panel 100 may be a curved display panel, or may be any type of display panel, such as a liquid crystal display panel, an organic light-emitting display panel, a quantum dot light-emitting display panel, a micro light-emitting diode display panel, and an electrophoresis display panel. For example, if the display panel 100 vibrates by the flexible vibration module 200 to generate a sound wave (e.g., sound) or to generate a haptic feedback responding to a touch, embodiments of the display panel 100 are not limited to a specific display panel.

The display panel 100 according to an embodiment may include a thin film transistor (TFT) array substrate, including a plurality of pixels defined by a plurality of gate lines and a plurality of data lines and a TFT in each of the plurality of pixels to drive each of the plurality of pixels, a light-emitting device layer on the TFT array substrate, and an encapsulation substrate covering the light-emitting device layer. For example, the encapsulation substrate may protect the TFT and the light-emitting device layer from an external impact, and may reduce or prevent water from penetrating into the light-emitting device layer. The display panel 100 according to an embodiment may include a display area AA for displaying an image according to driving of the plurality of pixels, and a non-display area BA surrounding the display area AA.

The display panel 100 according to an embodiment may include a bending portion that may be bent or curved to have a curved shape or a certain curvature radius. The bending portion of the display panel 100 may be in at least one of one edge (e.g., periphery) and the other edge (e.g., periphery) of the display panel 100, which are parallel to each other. The one edge and/or the other edge, where the bending portion is implemented, of the display panel 100 may include only the non-display area BA, or may include an edge or a periphery of the display area AA and the non-display area BA. For example, the display panel 100 including the bending portion implemented by bending of the non-display area BA may have a one-side bezel bending structure or a both-side bezel bending structure. Also, the display panel 100 including the bending portion implemented by bending of the edge or the periphery of the display area AA and the non-display area BA may have a one-side active bending structure or a both-side active bending structure.

The display apparatus according to an embodiment of the present disclosure may further include a rear structure 300 that supports the display panel 100 and a panel fixing member 400 between the display panel 100 and the rear structure 300. The rear structure 300 may be referred to, for example, as a cover bottom, a plate bottom, a back cover, a base frame, a metal frame, a metal chassis, a chassis base, or an m-chassis. Therefore, the rear structure 300 may be a supporter that supports the display panel 100, and may be implemented as a frame or a plate structure of an arbitrary type, on a rear surface of the display apparatus.

The rear structure 300 according to an embodiment may cover a whole rear surface of the display panel 100 with a gap space GS therebetween. For example, the rear structure 300 may include at least one of: a glass material, a metal material, and a plastic material, each having a plate shape. For example, an edge or a sharp corner of the rear structure 300 may have an inclined shape or a curved shape, e.g., through a chamfer process or a corner rounding process. For example, the glass material of the rear structure 300 may be sapphire glass. As another example, the rear structure 300, including the metal material, may include one or more of: aluminum (Al), an Al alloy, a magnesium (Mg) alloy, and an iron (Fe)-nickel (Ni) alloy.

The rear structure 300 according to an embodiment may additionally cover a side surface of the display panel 100. For example, the rear structure 300 may include a rear cover part 310 that covers the whole rear surface of the display panel 100 with the gap space GS therebetween, and a side cover part 330 connected to an end of the rear cover part 310 and covering the whole side surface of the display panel 100. However, the embodiments are not limited thereto. For example, the rear cover part 310 and the side cover part 330 of the rear structure 300 may be integrated as one body.

The side cover part 330 may be implemented as a separated middle frame coupled, or may be connected to the rear cover part 310. For example, the side cover part 330 implemented as the middle frame may cover the rear cover part 310, and for example, may cover all of a side surface of the rear cover part 310 and the side surface of the display panel 100. For example, the side cover part 330 implemented as the middle frame may include a material that is the same as or different from that of the rear structure 300.

The rear structure 300 according to an embodiment may be coupled or connected to a rear edge or periphery of the display panel 100 by using a panel fixing member 400. The panel fixing member 400 may be between the rear edge or periphery of the display panel 100 and an edge or a periphery of the rear structure 300, and may attach the display panel 100 to the rear structure 300. The panel fixing member 400 according to an embodiment may be implemented with a double-sided tape, a single-sided tape, or a double-sided adhesive foam pad, but embodiments are not limited thereto.

The display apparatus according to an embodiment of the present disclosure may further include a front structure 500 that covers the non-display area BA of the display panel 100. The front structure 500 may have a frame shape that may include an opening overlapping the display area AA of the display panel 100. For example, the front structure 500 may be coupled or connected to the rear cover part 310 or the middle frame, and may cover the non-display area BA of the display panel 100, thereby supporting or fixing the display panel 100. The front structure 500 may be in a front edge or periphery of the display panel 100, and may be directly exposed (visible) to a user (e.g., a viewer). Thus, an aesthetic design appearance of the display apparatus may be reduced, and a bezel width of the display apparatus may increase. To solve such a problem, according to an embodiment of the present disclosure, the display panel 100 may be coupled or connected to the rear structure 300 by the panel fixing member 400. Thus, the front structure 500 may be omitted (or removed), thereby decreasing the bezel width of the display apparatus and enhancing the aesthetic design appearance of the display apparatus.

The flexible vibration module 200 may be on the rear surface (e.g., a back surface) of the display panel 100. The flexible vibration module 200 may be attached to the rear surface of the display panel 100 by an adhesive member 150.

The adhesive member 150 according to an embodiment may be between the rear surface of the display panel 100 and the flexible vibration module 200. For example, the adhesive member 150 may attach the flexible vibration module 200 to the rear surface of the display panel 100, and may be an adhesive or a double-sided adhesive tape, including an adhesive layer that has a good adhesive force or attaching force. For example, the adhesive layer of the adhesive member 150 may include one or more of: epoxy, acryl, silicon, or urethane, but embodiments are not limited thereto. The adhesive layer of the adhesive member 150 may further include an additive, such as a tackifier or an adhesion enhancing agent, a wax component, or an anti-oxidation agent. The additive may prevent or reduce the adhesive member 150 from being detached (stripped) from the display panel 100 by a vibration of the vibration module 200. For example, the tackifier may be rosin derivative or the like, the wax component may be paraffin wax or the like, and the anti-oxidation agent may be a phenol-based anti-oxidation agent, such as thioester. However, embodiments are not limited thereto.

According to another example, the adhesive member 150 may further include a hollow portion between the display panel 100 and the flexible vibration module 200. The hollow portion of the adhesive member 150 may provide an air gap between the display panel 100 and the flexible vibration module 200. Due to the air gap, a sound wave (e.g., a sound pressure) based on a vibration of the flexible vibration module 200 may not be dispersed by the adhesive member 150, and may concentrate on the display panel 100. Thus, the loss of a vibration caused by the adhesive member 150 may be minimized or reduced, thereby increasing a sound pressure characteristic of a sound generated based on a vibration of the display panel 100.

The flexible vibration module 200 may be implemented as a film type. The flexible vibration module 200 may have a thickness that is thinner than that of the display panel 100. Thus, a thickness of the display panel 100 may not increase, despite the presence of the flexible vibration module 200. The flexible vibration module 200 may be referred to as, for example, a "sound generating module," a "sound generating device," a "film actuator," a "film-type piezoelectric composite actuator," a "film speaker," a "film-type piezoelectric speaker," or a "film-type piezoelectric composite speaker" that each uses the display panel 100 as a vibration plate, but the term is not limited thereto.

To secure a piezoelectric characteristic, the flexible vibration module 200 may include a piezoelectric ceramic. To improve an impact resistance of piezoelectric ceramic and realize flexibility, the flexible vibration module 200 may include a material, such as a polymer, in a piezoelectric ceramic. The flexible vibration module 200 according to an embodiment may include a plurality of first portions 210 and a plurality of second portions 220.

The plurality of first portions 210 according to an embodiment may each be configured as an inorganic material portion. The inorganic material portion may include an inflexible material. The inorganic material portion may include an electroactive material. The electroactive material may have a characteristic in which, when pressure or twisting (or bending) is applied to a crystalline structure by an external force, a potential difference occurs due to dielectric polarization caused by a relative position change of a positive (+) ion and a negative (−) ion, and a vibration is generated by an electric field based on a voltage applied thereto.

Each of the plurality of second portions 220 may alternate between pairs of the plurality of first portions 210. The plurality of first portions 210 and the plurality of second portions 220 may be disposed (or arranged) on the same plane (or the same layer) in parallel. Each of the plurality of second portions 220 may be configured to fill a gap or a space between two adjacent first portions of the plurality of first portions 210, and may be connected to or attached to a first portion 210 adjacent thereto. Therefore, in the flexible vibration module 200, vibration energy based on a link in a unit lattice of each first portion 210 may increase by a corresponding second portion 220. Thus, a vibration may increase, and a piezoelectric characteristic and flexibility may be secured. Also, in the flexible vibration module 200, the second portions 220 and the first portions 210 may be alternately disposed on the same plane in a lengthwise direction X with respect to one side of the flexible vibration module 200, and thus may configure a large-area composite film (e.g., an organic/inorganic composite film) having a single-layer structure. Therefore, the large-area composite film may have flexibility due to the plurality of second portions 220.

Each of the plurality of second portions 220 according to an embodiment may be configured as an organic material portion, and may fill a space between the inorganic material portions, which are the first portions 210. Each of the organic material portions may include a flexible material. Each of the organic material portions may be between the plurality of inorganic material portions, may absorb an impact or shock applied to the inorganic material portions (e.g., the first portions), may release a stress concentrating on the inorganic material portion to enhance the total durability of the flexible vibration module 200, and may provide flexibility to the flexible vibration module 200. The flexible vibration module 200 may have flexibility. The flexibility may be provided by the flexible organic portions, and not by the inflexible inorganic portions. Thus, the flexible vibration module 200 may be bent in a shape matching that of the display panel 100. The flexible vibration module 200 may vibrate according to an electrical signal to vibrate the display panel 100. For example, the flexible vibration module 200 may vibrate according to a voice signal synchronized with an image displayed by the display panel 100 to vibrate the display panel 100. As another example, the flexible vibration module 200 may be on the display panel 100, and may vibrate according to a haptic feedback signal (e.g., a tactile feedback signal) synchronized with a user touch applied to a touch panel (e.g., a touch sensor layer) embedded into the display panel 100 to vibrate the display panel 100. Accordingly, the display panel 100 may vibrate based on a vibration of the flexible vibration module 200 to provide a user (e.g., a viewer) with at least one of: sound and a haptic feedback. Embodiments are not limited to the above examples.

Therefore, in the flexible vibration module 200 of the display apparatus according to an embodiment of the present disclosure, an inorganic material portion (e.g., a first portion 210) and an organic material portion (e.g., a second portion 220) may be on the same layer. Thus, an impact transferred to the inorganic material portion may be absorbed by the organic material portion, thereby reducing or preventing the inorganic material portion from being damaged by an external impact applied to the display apparatus, and reducing or minimizing the reduction in vibration performance (e.g., the reduction in sound performance) caused by damage.

Moreover, the flexible vibration module 200 of the display apparatus according to an embodiment of the present disclosure may include piezoelectric ceramic having a perovskite crystalline structure. Thus, the flexible vibration module 200 may vibrate (e.g., mechanical displacement) in response to an electrical signal applied from the outside. For example, when an alternating current (AC) voltage is applied to the inorganic material portion (e.g., the first portion 210), the inorganic material portion may alternately contract and expand based on an inverse piezoelectric effect. Thus, the flexible vibration module 200 may vibrate based on a bending phenomenon in which a bending direction is alternately changed, thereby vibrating the display panel 100 based on the vibration of the flexible vibration module 200 to provide sound and/or a haptic feedback to a user.

Moreover, the flexible vibration module 200 according to an embodiment may have a size corresponding to the display area AA of the display panel 100. A size of the flexible vibration module 200 may be 0.9 to 1.1 times a size of the display area AA, but embodiments are not limited thereto. For example, a size of the flexible vibration module 200 may be the same as or approximately equal to that of the display area AA of the display panel 100. Thus, the flexible vibration module 200 may cover most of the display panel 100. Also, a vibration generated by the flexible vibration module 200 may vibrate the entire display panel 100. Thus, localization of a sound may be high, and satisfaction of a user may be improved. Also, a contact area (e.g., panel coverage) between the display panel 100 and the flexible vibration module 200 may increase. Thus, a vibration region of the display panel 100 may increase, thereby improving a sound of a middle- and/or a low-pitched sound band generated based on a vibration of the display panel 100. Also, in a large-sized display apparatus, the entire display panel 100 having a large size (e.g., a large area) may vibrate. Thus, localization of a sound based on a vibration of the display panel 100 may be further enhanced, thereby realizing a stereophonic sound effect.

Therefore, the flexible vibration module 200 according to an embodiment of the present disclosure may be on the rear surface of the display panel 100 to sufficiently vibrate the display panel 100 in a vertical (e.g., front-to-rear) direction, thereby outputting a desired sound to a forward region in front of the display apparatus. Also, a material in the flexible vibration module 200 may be implemented in a patterned shape, including an organic material portion and an inorganic material portion. Thus, an area (e.g., a size) of the flexible vibration module 200 may infinitely increase, whereby panel coverage of the flexible vibration module 200 may increase with respect to the display panel 100 to enhance a sound characteristic based on a vibration of the display panel 100. Also, the flexible vibration module 200 may be slimmed, thereby reducing or preventing the increase in a driving voltage. For example, the flexible vibration module 200 may be configured to have a wide area corresponding to the same size as that of the display panel 100. Thus, a sound pressure characteristic of a low-pitched sound band, which is a drawback of a film-type piezoelectric, may be improved, and the driving voltage may be reduced. Also, the flexible vibration module 200 according to an embodiment of the present disclosure may include the inorganic material portion and the organic material portion, and may be implemented as a thin-film type. Thus, the flexible vibration module 200 may be integrated into or equipped in the display apparatus without interference caused by a mechanical element and/or another element of the display apparatus.

Figure 3:
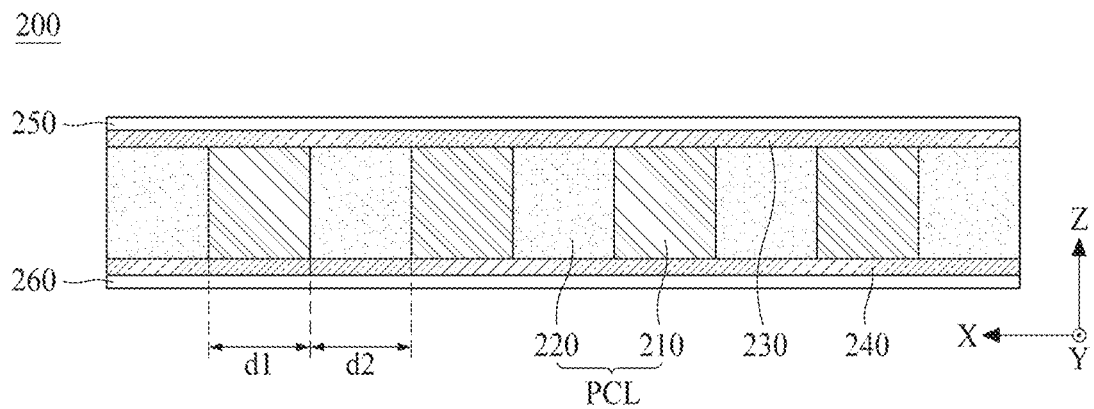
FIG. 3 is a cross-sectional view of a flexible vibration module of a display apparatus according to an embodiment of the present disclosure.

FIG. 3 is a cross-sectional view of a flexible vibration module of a display apparatus according to an embodiment of the present disclosure.

With reference to FIG. 3, in conjunction with FIG. 2, the flexible vibration module 200 may include a piezoelectric composite layer PCL, a first electrode layer 230, and a second electrode layer 240. The piezoelectric composite layer PCL may include a plurality of first portions 210 and a plurality of portions 220, each disposed between the plurality of first portions 210.

Each of the plurality of first portions 210 may include a polygonal pattern. For example, the plurality of first portions 210 may each include a line pattern having a first width d1, may be spaced apart from one another by a second width d2 (e.g., a certain interval) in a first direction X, and may be in parallel in a second direction Y intersecting the first direction X. Each of the plurality of first portions 210 may have the same size (for example, the same width, area, or volume) within a process error range (e.g., an allowable error or a tolerance) occurring in a manufacturing process.

Each of the plurality of first portions 210 according to an embodiment may include an inorganic material or a piezoelectric material, each of which vibrating based on a piezoelectric effect (e.g., a piezoelectric characteristic) caused by an electric field. For example, each of the plurality of first portions 210 may be referred to, for example, as an electro active portion, an inorganic material portion, a piezoelectric material portion, or a vibration portion, but embodiments are not limited thereto.

Each of the plurality of first portions 210 according to an embodiment may include a ceramic-based material for generating a relatively high vibration, or may include a piezoelectric ceramic having a perovskite-based crystalline structure. The perovskite crystalline structure may have a piezoelectric effect and an inverse piezoelectric effect, and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A", and "B" may be cations, and "O" may be anions. For example, the chemical formula "$ABO_3$" may include one of lead(II) titanate ($PbTiO_3$), lead zirconate ($PbZrO_3$), barium titanate ($BaTiO_3$), and strontium titanate ($SrTiO_3$), but embodiments are not limited thereto.

When the perovskite crystalline structure includes a center ion (for example, $PbTiO_3$, e.g., lead(II) titanate, lead titanium oxide, or lead titanate with a perovskite structure), a position of a titanium (Ti) ion may be changed by an external stress or a magnetic field. Thus, polarization may be changed, thereby generating a piezoelectric effect. For example, in the perovskite crystalline structure, a cubic shape corresponding to a symmetric structure may be changed to a tetragonal (e.g., quadrilateral), orthorhombic, or rhombohedral structure corresponding to an unsymmetric structure. Thus, a piezoelectric effect may be generated. In a tetragonal, orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

For example, the inorganic material portion provided in each of the plurality of first portions 210 may include a material, including one or more of: lead (Pb), zirconium (Zr), titanium (Ti), zinc (Zn), nickel (Ni), and niobium (Nb), but embodiments are not limited thereto. As another example, the inorganic material portion provided in each of the plurality of first portions 210 may include a lead zirconate titanate (PZT)-based material, including lead (Pb), zirconium (Zr), and titanium (Ti); or may include a lead zirconate nickel niobate (PZNN)-based material, including lead (Pb), zinc (Zn), nickel (Ni), and niobium (Nb), but embodiments are not limited thereto. Also, the inorganic material portion may include at least one of calcium titanate ($CaTiO_3$), $BaTiO_3$, and $SrTiO_3$, each without Pb, but embodiments are not limited thereto.

Each of the plurality of second portions 220 may include a polygonal pattern. Each of the plurality of second portions 220 may be between the plurality of first portions 210. The plurality of first portions 210 and the plurality of second portions 220 may be disposed (or arranged) on the same plane (or the same layer) in parallel. Each of the plurality of second portions 220 may fill a gap between two adjacent first portions of the plurality of first portions 210, and may be connected to or attached to a first portion 210 adjacent thereto. For example, the plurality of second portions 220 may each include a line pattern having a second width d2, and may be in parallel with the first portion 210 therebetween. Each of the plurality of second portions 220 may have the same size (for example, the same width, area, or volume) within a process error range (e.g., an allowable error or a tolerance) occurring in a manufacturing process.

A size of each of the second portions 220 may be the same as or different from that of each first portion 210. For example, a size of each first portion 210 and a size of each second portion 220 may adjust based on a desired condition including the vibration characteristic and/or flexibility of the flexible vibration module 200.

Each of the plurality of second portions 220 may have modulus and viscoelasticity that are lower than those of each first portion 210. Thus, the plurality of second portions 220 may enhance the reliability of each first portion 210 vulnerable to an impact due to a fragile characteristic. For example, when the flexible vibration module 200 for vibrating the display panel 100 has an impact resistance and high stiffness, the flexible vibration module 200 may have a high or maximum vibration characteristic. For the flexible vibration module 200 to have an impact resistance and high stiffness, the plurality of second portions 220 may each include a material having a relatively high damping factor (tan δ) and relatively high stiffness. For example, the plurality of second portions 220 may each include a material having a damping factor (tan δ) of about 0.1 [Gpa] to about 1 [Gpa] and relatively high stiffness of about 0 [Gpa] to about 10 [Gpa]. Also, a damping factor (tan δ) and a stiff characteristic may be described based on a correlation between a loss coefficient and modulus. For example, the plurality of second portions 220 may each include a material having a loss coefficient of about 0.01 to about 1 and modulus of about 1 [Gpa] to about 10 [Gpa].

The organic material portion in each of the plurality of second portions 220 may include an organic material or an organic polymer that each has a flexible characteristic in comparison with the inorganic material portion of each of the first portions 210. For example, each of the plurality of second portions 220 may include one or more of an organic material, an organic polymer, an organic piezoelectric material, and an organic non-piezoelectric material. For example, each of the plurality of second portions 220 may be referred to, for example, as an adhesive portion, an elastic portion, a bending portion, a damping portion, or a flexible portion, but embodiments are not limited thereto. An organic material portion according to an embodiment may include at least one of an organic piezoelectric material and an organic non-piezoelectric material.

An organic material portion including an organic piezoelectric material may absorb an impact applied to an inorganic material portion (e.g., a first portion 210). Thus, the organic material portion may enhance the total durability of the flexible vibration module 200, and may provide a piezoelectric characteristic corresponding to a certain level or more. The organic piezoelectric material according to an embodiment may be an organic material having an electro active characteristic. For example, the organic piezoelectric material may include at least one of polyvinylidene fluoride (PVDF), β-polyvinylidene fluoride (β-PVDF), and polyvinylidene-trifluoroethylene (PVDF-TrFE), but embodiments are not limited thereto.

An organic material portion including an organic non-piezoelectric material may include a curable resin composition and an adhesive including the curable resin composition. Thus, the organic material portion may absorb an impact applied to an inorganic material portion (e.g., a first portion), thereby enhancing the total durability of the flexible vibration module 200. The organic non-piezoelectric material according to an embodiment may include at least one of an epoxy-based polymer, an acryl-based polymer, and a silicon-based polymer, but embodiments are not limited thereto.

For example, an organic material portion including an organic non-piezoelectric material may include an adhesion promoter or an adhesion enhancing agent for adhesiveness between epoxy resin and an inorganic material portion, for a high stiffness characteristic for the flexible vibration module 200. For example, the adhesion promoter may be phosphate or the like. The organic material portion may be cured by at least one curing process of a thermal curing process and a photo-curing process. In a process of curing the organic material portion, solvent free type epoxy resin may be used for avoiding or preventing the thickness uniformity of the flexible vibration module 200 from being reduced by contraction of the organic material portion caused by volatilization of a solvent.

Moreover, the organic material portion including the organic non-piezoelectric material may further include a reinforcing agent, e.g., for a damping characteristic in addition to high stiffness of the flexible vibration module 200. For example, the reinforcing agent may be methylmethacrylate-butadiene-styrene (MBS) having a core shell type, and a content thereof may be about 5 wt % to about 40 wt %. The reinforcing agent may be an elastic body having the core cell type, and may have a high coupling force to epoxy resin, such as an acryl-based polymer. Thus, the reinforcing agent may enhance an impact resistance or a damping characteristic of the flexible vibration module 200.

In the piezoelectric composite layer PCL, the first portions 210 including an inorganic material and having a piezoelectric characteristic, and the second portions 220 including an organic material and having flexibility, may be alternately repeated and connected to one another. Thus, the piezoelectric composite layer PCL may have a thin-film type. Therefore, the piezoelectric composite layer PCL may be bent based on a shape of the display panel 100, and may have a size corresponding to the display panel 100, or may have a size for realizing a vibration characteristic or a sound characteristic, which may each be set based on a vibration of the display panel 100. For example, a size of each first portion 210 and a size of each second portion 220 may be adjusted based on a piezoelectric characteristic and flexibility. For example, in a display apparatus desiring more of a piezoelectric characteristic than flexibility, a size of each first portion 210 may be greater than that of each second portion 220. As another example, in a display apparatus desiring more flexibility than a piezoelectric characteristic, a size of each second portion 220 may be greater than that of each first portion 210. Accordingly, the piezoelectric composite layer PCL may be adjusted based on a characteristic desired for a display apparatus. Thus, it may be easy to design the piezoelectric composite layer PCL.

The first electrode layer 230 may be on a first surface (e.g., a front surface) of the piezoelectric composite layer PCL, and may be electrically connected to a first surface of each of the plurality of first portions 210. The first electrode layer 230 according to an embodiment may include a transparent conductive material, a semitransparent (or translucent) conductive material, or an opaque conductive material. Examples of the transparent conductive material or the semitransparent conductive material may include indium tin oxide (ITO) or indium zinc oxide (IZO), but embodiments are not limited thereto. Examples of the opaque conductive material may include aluminum (Al), copper (Cu), gold (Au), silver (Ag), molybdenum (Mo), magnesium (Mg), and an alloy of any thereof, but embodiments are not limited thereto.

The second electrode layer 240 may be on a second surface (e.g., a rear surface) opposite to the first surface of the piezoelectric composite layer PCL, and may be electrically connected to a second surface of each of the plurality of first portions 210. The second electrode layer 240 according to an embodiment may include a transparent conductive material, a semitransparent conductive material, or an opaque conductive material. For example, the second electrode layer 240 may include the same material as that of the first electrode layer 230. The piezoelectric composite layer PCL may be polarized by a certain voltage applied to the first electrode layer 230 and the second electrode layer 240 in a certain temperature atmosphere, or a temperature atmosphere that may be changed from a high temperature to a room temperature. Embodiments are not limited to these examples.

The flexible vibration module 200 according to an embodiment of the present disclosure may further include a first protection film 250 and a second protection film 260. The first protection film 250 may be on the first electrode layer 230, and may protect the first surface of the piezoelectric composite layer PCL or the first electrode layer 230. For example, the first protection film 250 may be a polyimide (PI) film or a polyethyleneterephthalate (PET) film, but embodiments are not limited thereto.

The second protection film 260 may be on the second electrode layer 240, and may protect the second surface of the piezoelectric composite layer PCL or the second electrode layer 240. For example, the second protection film 260 may be a polyimide (PI) film or a polyethyleneterephthalate (PET) film, but embodiments are not limited thereto.

Figure 4:
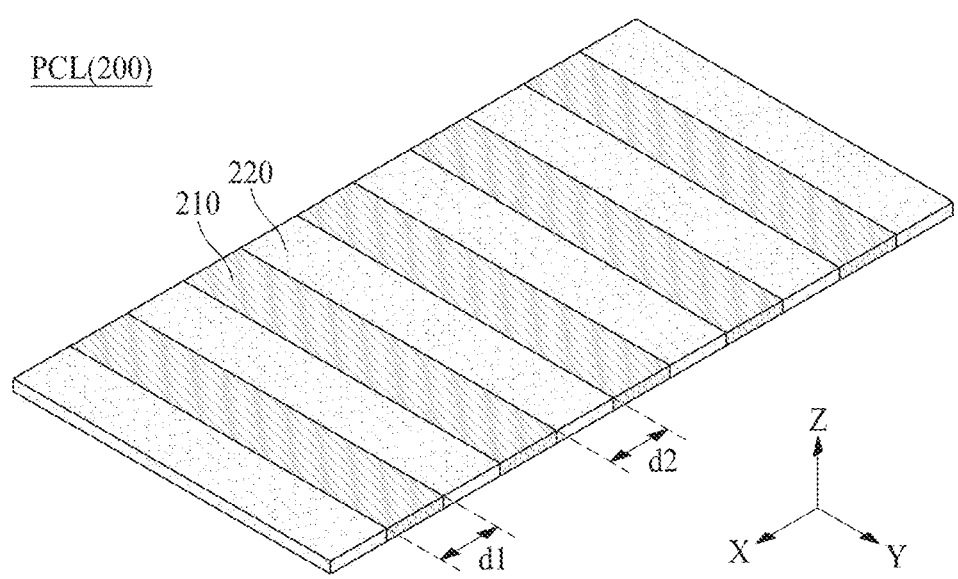
FIG. 4 is a diagram illustrating a piezoelectric composite layer according to a first embodiment of the present disclosure.

FIG. 4 is a diagram illustrating a piezoelectric composite layer according to a first embodiment of the present disclosure.

With reference to FIG. 4, the piezoelectric composite layer PCL according to the first embodiment of the present disclosure may include a plurality of first portions 210 and a plurality of second portions 220, which may be alternately disposed in a first direction X. Each of the plurality of first portions 210 may have a first width d1 parallel to the first direction X, and may have a length parallel to a second direction Y. Each of the plurality of second portions 220 may have a second width d2, which may be the same as the first width d1, and may have a length parallel to the second direction Y. For example, the first portions 210 and the second portions 220 may each have a line type or a stripe type, each having the same size.

Therefore, in the piezoelectric composite layer PCL according to the first embodiment of the present disclosure, the first portions 210 and the second portions 220, each having the same size, may be alternately disposed (or connected) on the same plane. Thus, the piezoelectric composite layer PCL may have a single thin-film type, may vibrate in a vertical direction by the first portions 210, and may be bent in a curved shape by the second portions 220. The piezoelectric composite layer PCL according to the first embodiment of the present disclosure may be enlarged to have a desired size or length, e.g., through side coupling (or connection) of the first portions 210 and the second portions 220.

Figure 5A:
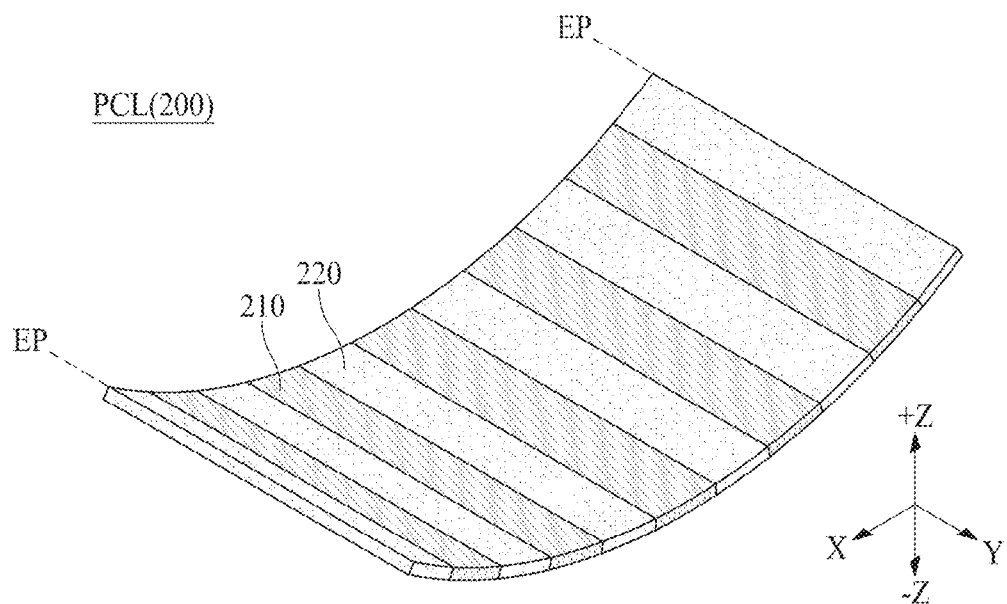
FIG. 5A is a diagram illustrating an example in which both ends of the piezoelectric composite layer of FIG. 4 are folded upward.
Figure 5B:
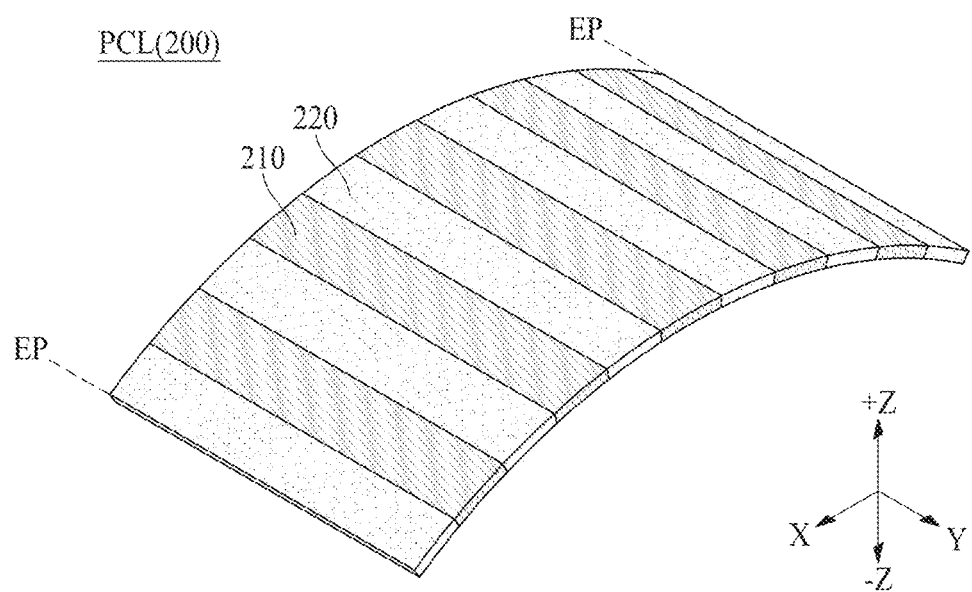
FIG. 5B is a diagram illustrating an example in which the both ends of the piezoelectric composite layer of FIG. 4 are folded downward.

FIG. 5A is a diagram illustrating an example in which both ends of the piezoelectric composite layer of FIG. 4 are folded upward. FIG. 5B is a diagram illustrating an example in which the both ends of the piezoelectric composite layer of FIG. 4 are folded downward.

With reference to FIGS. 5A and 5B, the piezoelectric composite layer PCL according to the first embodiment of the present disclosure may vibrate with an electric field based on a signal applied to each of the plurality of first portions 210 having a line pattern. Thus, both ends EP in a first lengthwise direction X may be folded in an upward direction +Z, or may be folded in a downward direction −Z. For example, each of the plurality of second portions 220 filled or disposed between two adjacent first portions of the plurality of first portions 210 may have flexibility. Thus, even when the both ends EP of the piezoelectric composite layer PCL are bent in the upward direction +Z or the downward direction −Z, the inorganic material portion, which is each first portion 210, may not be damaged or may not be reduced in performance. Therefore, the display apparatus including the flexible vibration module 200 including the piezoelectric composite layer PCL according to the first embodiment of the present disclosure may be used as, for example, a curved display apparatus bent at a certain curvature radius, but embodiments are not limited thereto. For example, the display apparatus may be used as a rollable display apparatus wound in a spiral form, a bendable display apparatus, or a wearable display apparatus. The bendable display apparatus may be an edge-bending display apparatus, a bezel-bending display apparatus, or an active-bending display apparatus, but embodiments are not limited thereto.

Figure 6:
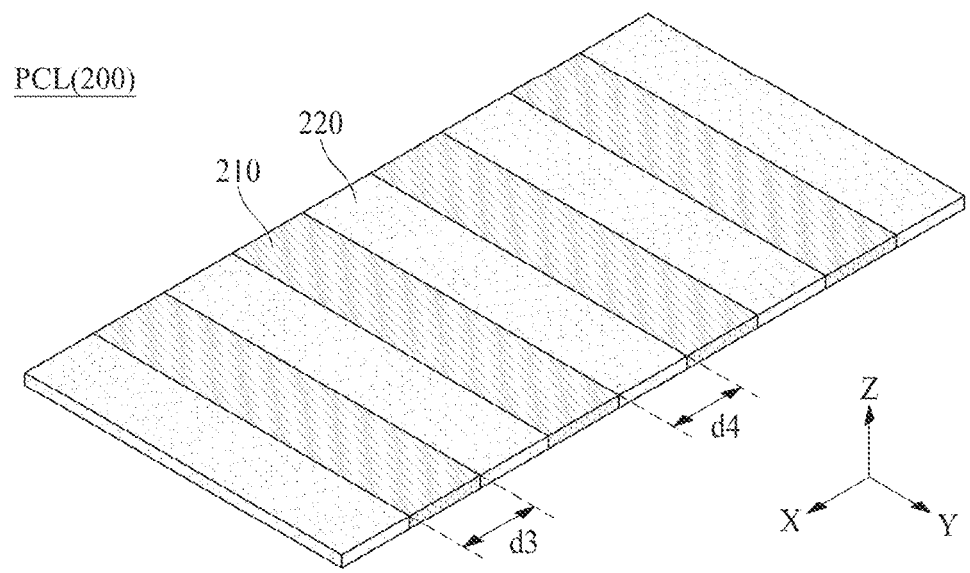
FIG. 6 is a diagram illustrating a piezoelectric composite layer according to a second embodiment of the present disclosure.

FIG. 6 is a diagram illustrating a piezoelectric composite layer according to a second embodiment of the present disclosure.

FIG. 6 illustrates an embodiment implemented by modifying the first portions 210 of the piezoelectric composite layer PCL illustrated in FIG. 4. Thus, a repetitive description is omitted or will be briefly given below.

With reference to FIG. 6, in a piezoelectric composite layer PCL according to a second embodiment of the present disclosure, a plurality of first portions 210 and a plurality of second portions 220 may have different sizes. Each of the plurality of first portions 210 may have a third width d3, and each of the plurality of second portions 220 may have a fourth width d4 differing from the third width d3. For example, the third width d3 of each first portion 210 may be greater than the fourth width d4 of each second portion 220. Also, the third width d3 of each first portion 210 may be greater than the first width d1 of each first portion 210 illustrated in FIG. 4.

In the piezoelectric composite layer PCL, when the third width d3, which is a width of an inorganic material portion of each first portion 210, is greater than the fourth width d4, which is a width of an organic material portion of each second portion 220, flexibility may be reduced. However, when a size of the inorganic material portion, which is relatively good in vibration characteristic of a high-pitched sound band, increases, the piezoelectric composite layer PCL may have an improved high-pitched sound characteristic.

In the piezoelectric composite layer PCL according to the second embodiment of the present disclosure, each of the first portions 210 may have a size that is greater than that of each of the second portions 220. Thus, the vibration characteristic of the high-pitched sound band may increase. For example, a content (e.g., a ratio) of the first portions 210 in the piezoelectric composite layer PCL illustrated in FIG. 6 may be the same as a content (e.g., a ratio) of the first portions 210 in the piezoelectric composite layer PCL illustrated in FIG. 4. However, when a size of each first portion 210 increases, the piezoelectric composite layer PCL illustrated in FIG. 6 may further improve the vibration characteristic of the high-pitched sound band as compared to the piezoelectric composite layer PCL illustrated in FIG. 4.

Therefore, when a size of each first portion 210 included in the piezoelectric composite layer PCL of the flexible vibration module 210 increases (or enlarges), a display apparatus including the piezoelectric composite layer PCL according to the second embodiment of the present disclosure may have an improved sound characteristic of the high-pitched sound band generated by a vibration of the display panel 100 based on a vibration of the flexible vibration module 200. Also, the display apparatus, including the piezoelectric composite layer PCL, according to the second embodiment of the present disclosure may be used in a flexible display apparatus that may be substantially similar to the display apparatus including the flexible vibration module 200 illustrated in FIG. 4.

Figure 7:
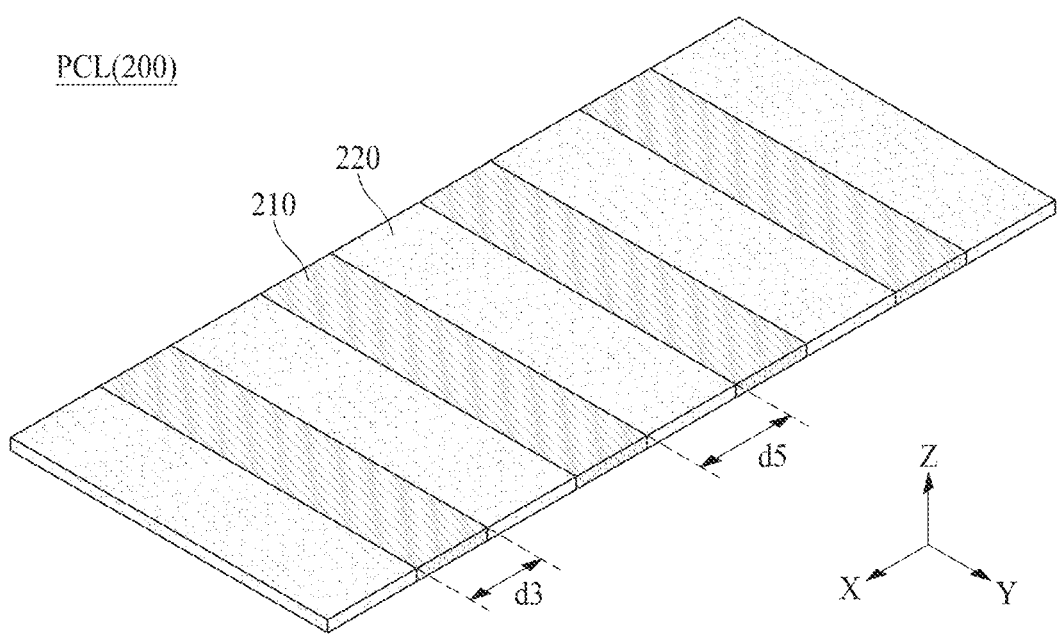
FIG. 7 is a diagram illustrating a piezoelectric composite layer according to a third embodiment of the present disclosure.

FIG. 7 is a diagram illustrating a piezoelectric composite layer according to a third embodiment of the present disclosure.

FIG. 7 illustrates an embodiment implemented by modifying the first portions 210 and the second portions 220 of the piezoelectric composite layer PCL illustrated in FIG. 4. Thus, a repetitive description is omitted or will be briefly given below.

With reference to FIG. 7, in a piezoelectric composite layer PCL according to a third embodiment of the present disclosure, a plurality of first portions 210 and a plurality of second portions 220 may have different sizes or may have the same size. Each of the plurality of first portions 210 may have a third width d3. Each of the plurality of second portions 220 may have a fifth width d5 differing from the third width d3. For example, the third width d3 of each first portion 210 may be greater than the first width d1 of each first portion 210 illustrated in FIG. 4, and the fifth width d5 of each second portion 220 may be greater than the fourth width d4 of each second portion 220 illustrated in FIG. 6.

In the piezoelectric composite layer PCL according to the third embodiment of the present disclosure, a size of each first portion 210 and a size of each second portion 220 may increase. Thus, the piezoelectric composite layer PCL illustrated in FIG. 7 may further increase in vibration characteristic of the middle- and/or low-pitched sound bands than the piezoelectric composite layer PCL illustrated in each of FIGS. 4 and 6. For example, a content (e.g., a ratio) of the first portions 210 in the piezoelectric composite layer PCL illustrated in FIG. 7 may be higher than a content (e.g., a ratio) of the first portions 210 in the piezoelectric composite layer PCL illustrated in FIG. 4. Also, a content (e.g., a ratio) of the second portions 220 in the piezoelectric composite layer PCL illustrated in FIG. 7 may be higher than a content (e.g., a ratio) of the second portions 220 in the piezoelectric composite layer PCL illustrated in each of FIGS. 4 and 6. For example, the piezoelectric composite layer PCL illustrated in FIG. 7 may have a size enlargement effect of each of the first and second portions 210 and 220. Thus, due to an effect in which panel coverage of flexible vibration module 200 increases with respect to the display panel 100, rather than the flexible vibration module 200, a vibration characteristic of the low-pitched sound band may further increase.

Therefore, due to an effect in which all of a size of each of the first and second portions 210 and 220 included in the piezoelectric composite layer PCL increases, a display apparatus including the piezoelectric composite layer PCL according to the third embodiment of the present disclosure may increase in a sound characteristic of the low-pitched sound band, as well as in a sound characteristic of the high-pitched sound band generated by a vibration of the display panel 100. Thus, flatness of a sound pressure may be improved due to the increase in sound characteristic of the low-pitched sound band. Also, the display apparatus including the piezoelectric composite layer PCL according to the third embodiment of the present disclosure may be used in a flexible display apparatus that may be substantially similar to the display apparatus including the flexible vibration module 200 illustrated in FIG. 4.

Figure 8:
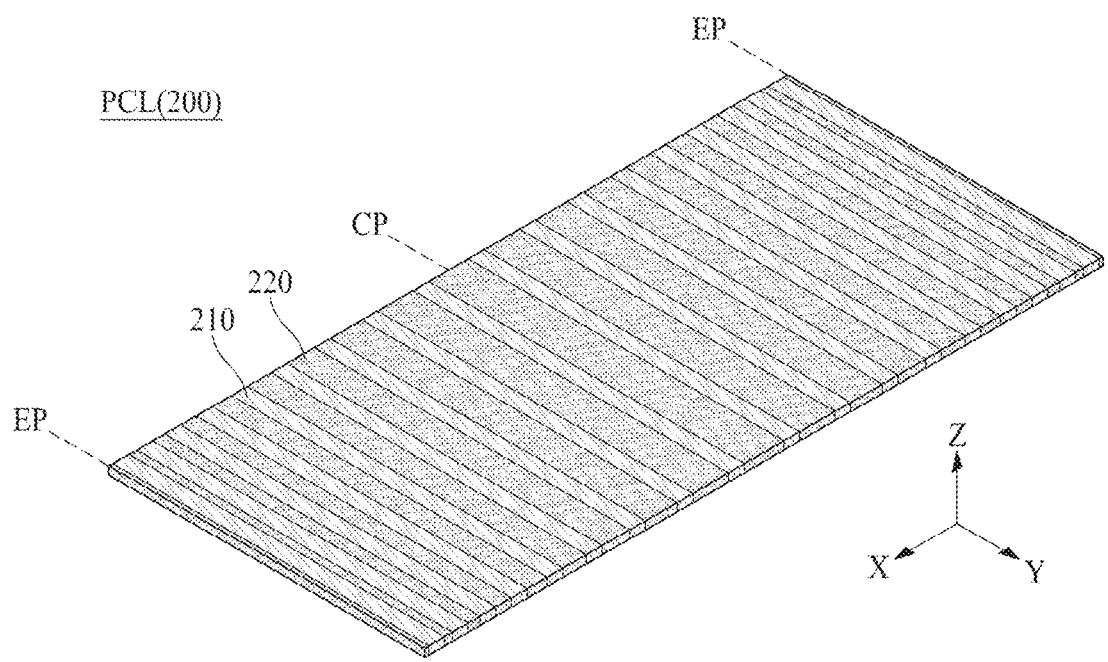
FIG. 8 is a diagram illustrating a piezoelectric composite layer according to a fourth embodiment of the present disclosure.
Figure 9:
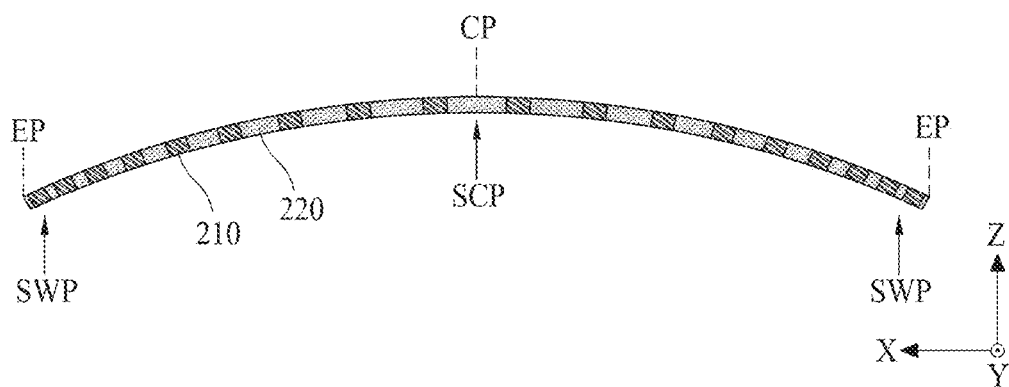
FIG. 9 is a diagram illustrating an example in which both ends of the piezoelectric composite layer of FIG. 8 are folded downward.

FIG. 8 is a diagram illustrating a piezoelectric composite layer according to a fourth embodiment of the present disclosure. FIG. 9 is a diagram illustrating an example in which both ends of the piezoelectric composite layer of FIG. 8 are folded downward.

FIG. 8 illustrates an embodiment implemented by modifying the second portions 220 of the piezoelectric composite layer PCL illustrated in FIG. 4. Thus, a repetitive description is omitted or will be briefly given below. With reference to FIGS. 8 and 9, in the piezoelectric composite layer PCL according to the fourth embodiment of the present disclosure, a size (e.g., a width) of each of a plurality of second portions 220, between a plurality of first portions 210, may progressively decrease in a direction from a center portion CP to both edges or both peripheries (e.g., both ends) EP of the piezoelectric composite layer PCL or a flexible vibration module 200.

A largest second portion 220, having a largest size among the plurality of second portions 220, may be located in a portion SCP on which a highest stress may concentrate when the flexible vibration module 200 is vibrating in a vertical direction Z, and a smallest second portion 220, having a smallest size among the plurality of second portions 220, may be located in a portion SWP where a relatively low stress may occur when the flexible vibration module 200 is vibrating in the vertical direction Z. For example, the largest second portion 220, having the largest size among the plurality of second portions 220, may be located in the center portion CP of the flexible vibration module 200, and the smallest second portion 220, having the smallest size among the plurality of second portions 220 may be located in each of the both edges or peripheries EP of the flexible vibration module 200. Therefore, when the flexible vibration module 200 is vibrating in the vertical direction Z, interference of a sound wave or overlapping of a resonance frequency, each occurring in the portion SCP on which the highest stress concentrates, may be reduced or minimized. Thus, dipping of a sound pressure occurring in the low-pitched sound band may be reduced, thereby improving flatness of a sound characteristic in the low sound band. Here, flatness of a sound characteristic may be a level of a deviation between a highest sound pressure and a lowest sound pressure.

The center portion CP of the flexible vibration module 200 may correspond to a second portion 220. The center portion CP of the flexible vibration module 200 may overlap a second portion 220. For example, the center portion CP of the flexible vibration module 200 may overlap a center of the second portion 220. For example, when the flexible vibration module 200 is vibrating in the vertical direction Z, flexibility of the center portion CP of the flexible vibration module 200 may increase. For example, when the center portion CP of the flexible vibration module 200 overlaps a first portion 210 or corresponds to the first portion 210, when the flexible vibration module 200 is vibrating in the vertical direction Z, the first portion 210 may be damaged or reduced in performance due to stress concentrating on the center portion CP of the flexible vibration module 200. Accordingly, when the center portion CP of the flexible vibration module 200 overlaps a second portion 220 or corresponds to the second portion 220, when the flexible vibration module 200 is vibrating in the vertical direction Z, the second portion 220 may not be damaged or reduced in performance in the portion SCP on which stress may concentrate.

For example, each of the plurality of first portions 210 may have the same size (e.g., width). As another example, each of the plurality of first portions 210 may have different sizes (e.g., widths). For example, a size (e.g., a width) of each of the plurality of first portions 210 may progressively decrease or increase in a direction from the center portion CP to the both edges (e.g., both ends) EP of the piezoelectric composite layer PCL or the flexible vibration module 200. For example, in the flexible vibration module 200, a sound pressure characteristic of a sound may be enhanced and a sound reproduction band may increase, based on various natural vibration frequencies based on a vibration of each of the plurality of first portions 210 having different sizes. Therefore, the display apparatus including the piezoelectric composite layer PCL according to the fourth embodiment of the present disclosure may be used in a flexible display apparatus that may be substantially similar to a display apparatus including the flexible vibration module 200 illustrated in FIG. 4.

Figure 10:
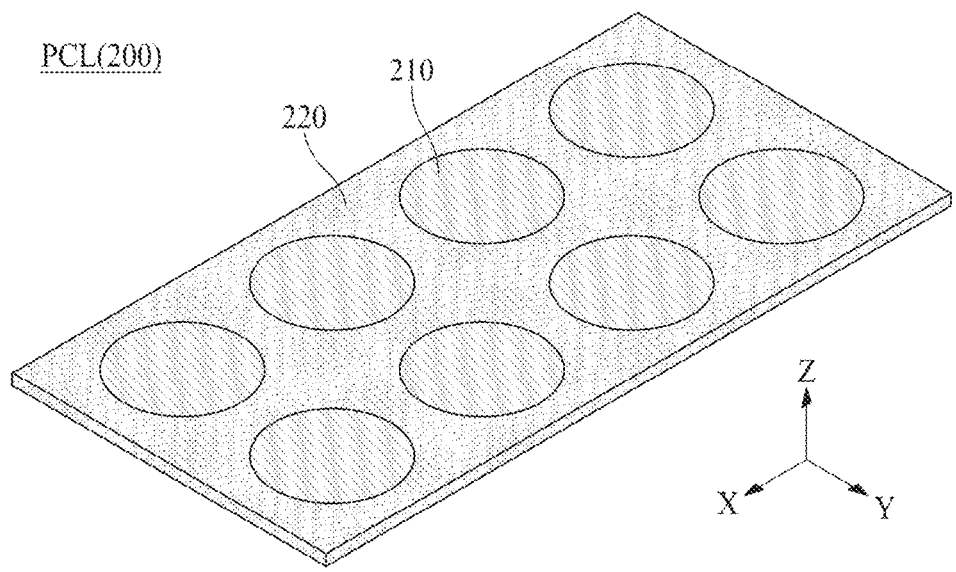
FIG. 10 is a diagram illustrating a piezoelectric composite layer according to a fifth embodiment of the present disclosure.

FIG. 10 is a diagram illustrating a piezoelectric composite layer according to a fifth embodiment of the present disclosure.

With reference to FIG. 10, the piezoelectric composite layer PCL according to the fifth embodiment of the present disclosure may include a plurality of first portions 210, which may each have a circular shape and may be spaced apart from one another, and a second portion 220 surrounding each of the plurality of first portions 210. Each of the plurality of first portions 210 may have a circular plate shape. Each of the plurality of first portions 210 may include an inorganic material portion having a vibration characteristic as described above. Thus, a repetitive description of the material is omitted.

The second portion 220 may be disposed or filled between the plurality of first portions 210, and may surround a side surface of each of the plurality of first portions 210. The second portion 220 may include an organic material portion having flexibility as described above. Thus, its repetitive description is omitted. The second portion 220 may provide flexibility between two adjacent first portions of the plurality of first portions 210. Thus, a shape of the piezoelectric composite layer PCL or the flexible vibration module 200 may have various shapes, such as a two-dimensional (2D) or three-dimensional (3D) shape, based on deformation occurring between two adjacent first portions of the plurality of first portions 210.

Each of the plurality of first portions 210 may have various shapes, in addition to a circular plate shape. For example, each of the plurality of first portions 210 may have an oval shape, a polygonal shape, or a donut shape, but embodiments are not limited thereto. An oval shape may include an elliptical shape, an egg-shape, a rectangular shape with rounded corners, or other non-circular curved shape having a width different from its height.

Each of the plurality of first portions 210 may have a dotted shape including, for example, a fine (e.g., micro) circular shape, a fine oval shape, a fine polygonal shape, or a fine donut shape. A shape of a display apparatus including a flexible vibration module 200 including the plurality of first portions 210 may have various shapes, based on flexibility of the second portion 220 between two adjacent first portions of the plurality of first portions 210. For example, a shape of a display panel of a display apparatus including the flexible vibration module 200 illustrated in each of FIGS. 4 to 9 may be a 2D shape, which may be concave or convex, based on the first portions 210 (e.g., an inorganic material portion) having a line shape. Thus, a shape of a display panel of a display apparatus including the flexible vibration module 200 illustrated in FIG. 10 may have various shapes, such as a 3D shape, as well as a 2D shape, based on the first portions 210 (e.g., an inorganic material portion) having a dotted shape. Accordingly, the flexible vibration module 200 including the piezoelectric composite layer PCL according to the fifth embodiment of the present disclosure may be enhanced in degree of freedom in design based on a shape of a display apparatus, and may be applied to a flexible display apparatus having a shape capable of being changed to various shapes, such as a 2D shape or a 3D shape.

Figure 11:
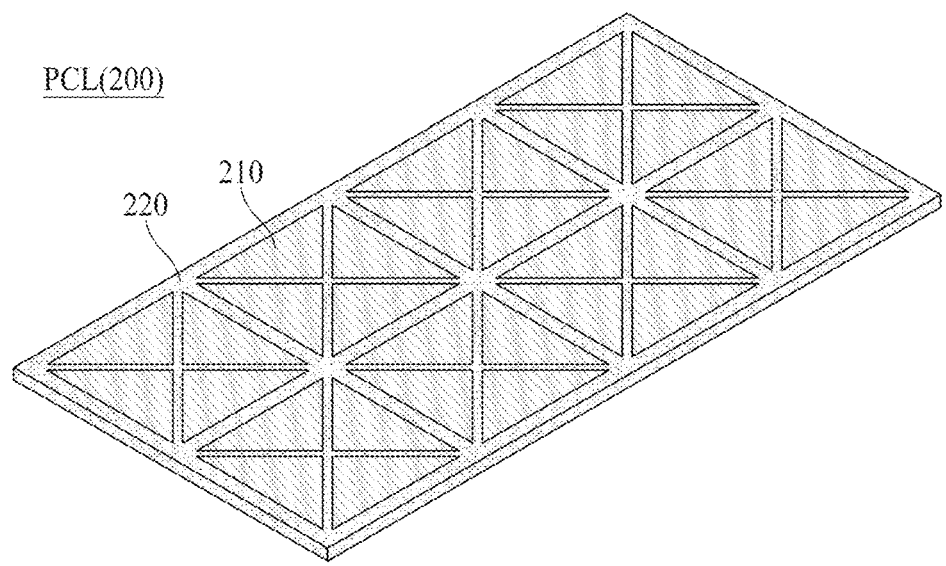
FIG. 11 is a diagram illustrating a piezoelectric composite layer according to a sixth embodiment of the present disclosure.
Figure 12:
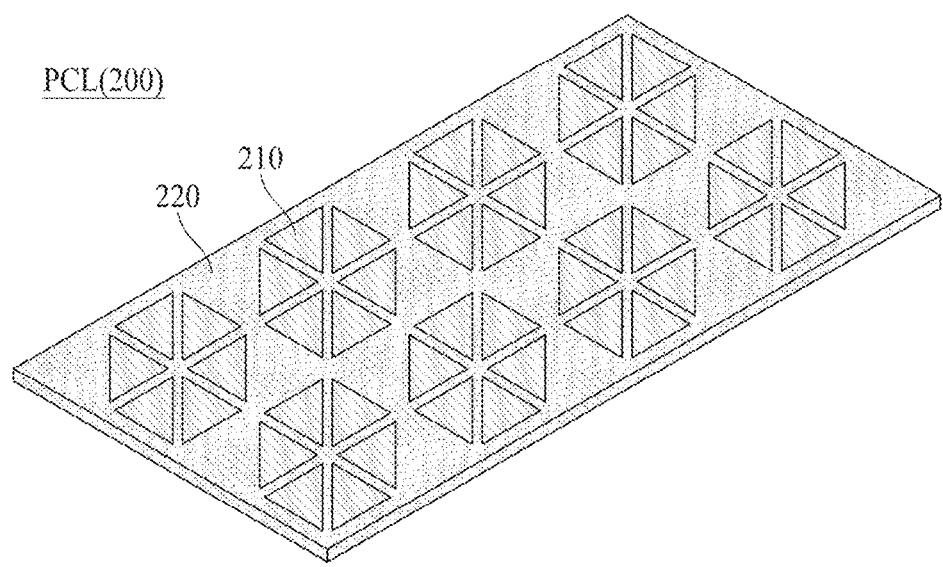
FIG. 12 is a diagram illustrating an embodiment of the piezoelectric composite layer illustrated in FIG. 11.

FIG. 11 is a diagram illustrating a piezoelectric composite layer according to a sixth embodiment of the present disclosure. FIG. 12 is a diagram illustrating an embodiment of the piezoelectric composite layer illustrated in FIG. 11.

With reference to FIG. 11, the piezoelectric composite layer PCL according to the sixth embodiment of the present disclosure may include a plurality of first portions 210, which may each have a triangular shape, and may be spaced apart from one another, and a second portion 220 surrounding each of the plurality of first portions 210. Each of the plurality of first portions 210 may have a triangular shape. For example, each of the plurality of first portions 210 may have a triangular plate shape. Each of the plurality of first portions 210 may include an inorganic material portion having a vibration characteristic as described above. Thus, its repetitive description is omitted.

For example, four adjacent first portions 210 of the plurality of first portions 210 may be adjacent to one another to form a tetragonal or quadrilateral shape (e.g., a square shape). Vertices of the four adjacent first portions 210 forming a tetragonal shape may be adjacent to one another in a center portion of the tetragonal shape. As another example, as illustrated in FIG. 12, six adjacent first portions 210 of the plurality of first portions 210 may be adjacent to one another to form a hexagonal shape (e.g., a regularly hexagonal shape). Vertices of the six adjacent first portions 210 forming a hexagonal shape may be adjacent to one another in a center portion of the hexagonal shape. Therefore, 2N (where N is a natural number greater than or equal to 2) adjacent first portions 210 of the plurality of first portions 210 may be disposed adjacent to one another to form a 2N-angular shape.

The second portion 220 may be disposed or filled between the plurality of first portions 210, and may surround a side surface of each of the plurality of first portions 210. The second portion 220 may include an organic material portion having flexibility, as described above. Thus, its repetitive description is omitted. The second portion 220 may provide flexibility between two adjacent first portions of the plurality of first portions 210. Thus, a shape of the piezoelectric composite layer PCL or the flexible vibration module 200 may have various shapes, such as a 3D shape, as well as a 2D shape, based on deformation occurring between two adjacent first portions of the plurality of first portions 210.

Therefore, in a display apparatus including a flexible vibration module 200 having the piezoelectric composite layer PCL according to the sixth embodiment of the present disclosure, a display panel may change based on various 3D shape changes of the flexible vibration module 200. Also, the plurality of first portions 220 having a triangular shape may have a fine pattern (e.g., micro pattern) corresponding to various shapes, and a display panel of a display apparatus including the flexible vibration module 200 including the first portions 210 may have various shapes based on flexibility of the second portion 220 between two adjacent first portions of the plurality of first portions 210. Also, a display apparatus including the piezoelectric composite layer PCL according to the sixth embodiment of the present disclosure may be used in a flexible display apparatus that may be substantially similar to a display apparatus including the flexible vibration module 200 illustrated in FIG. 4.

Figure 13:
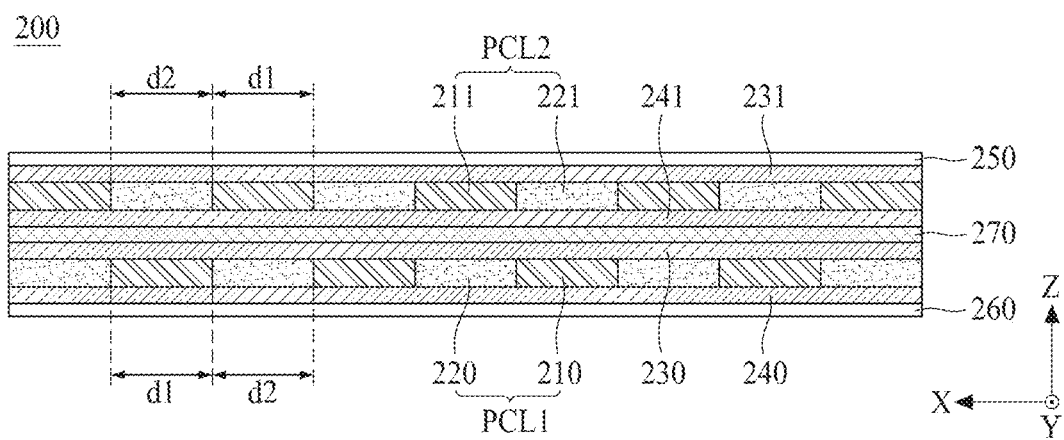
FIG. 13 is a diagram illustrating a flexible vibration module according to another embodiment of the present disclosure.

FIG. 13 is a diagram illustrating a flexible vibration module according to another embodiment of the present disclosure.

With reference to FIG. 13, the flexible vibration module 200 according to another embodiment of the present disclosure may include a first piezoelectric composite layer PCL1, a first electrode layer 230, a second electrode layer 240, an insulation layer 270, a second piezoelectric composite layer PCL2, a third electrode layer 231, and a fourth electrode layer 241. The first piezoelectric composite layer PCL1 may include a plurality of first portions 210 and a plurality of second portions 220, each disposed between the plurality of first portions 210.

Each of the plurality of first portions 210 may include an inorganic material or a piezoelectric material that may each vibrate based on a piezoelectric effect (e.g., a piezoelectric characteristic) based on an electric field, and may be substantially similar to the first portions illustrated in each of FIGS. 3 to 7. Thus, their repetitive descriptions are omitted. Each of the plurality of second portions 220 may include an organic material portion having flexibility, and may be substantially similar to the second portions illustrated in each of FIGS. 3 to 7. Thus, their repetitive descriptions are omitted.

The first electrode layer 230 may be on a first surface (e.g., a front surface) of the first piezoelectric composite layer PCL1, and may be electrically connected to a first surface of each of the plurality of first portions 210. The first electrode layer 230 according to an embodiment may include a transparent conductive material, a semitransparent conductive material, or an opaque conductive material.

The second electrode layer 240 may be on a second surface (e.g., a rear surface) opposite to the first surface of the first piezoelectric composite layer PCL1, and may be electrically connected to a second surface of each of the plurality of first portions 210. The second electrode layer 240 according to an embodiment may include a transparent conductive material, a semitransparent conductive material, or an opaque conductive material. For example, the second electrode layer 240 may include the same material as that of the first electrode layer 230.

The insulation layer 270 may be on the first electrode layer 230. The insulation layer 270 may include an electrical insulating material that has adhesiveness and is compressible and restorable. For example, the insulation layer 270 may include at least one of: an epoxy-based polymer, an acryl-based polymer, and a silicon-based polymer, but embodiments are not limited thereto.

The second piezoelectric composite layer PCL2 may be on the insulation layer 270. The second piezoelectric composite layer PCL2 may include a plurality of first portions 211 and a plurality of second portions 221, each disposed between the plurality of first portions 211. Each of the plurality of first portions 211 of the second piezoelectric composite layer PCL2 may include an inorganic material or a piezoelectric material that may each vibrate based on a piezoelectric effect (e.g., a piezoelectric characteristic), based on an electric field, and may be the same as the plurality of first portions 210 of the first piezoelectric composite layer PCL1.

For example, the first portions 211 of the second piezoelectric composite layer PCL2 may respectively overlap the first portions 210 of the first piezoelectric composite layer PCL1. For example, the first portions 211 of the second piezoelectric composite layer PCL2 may respectively correspond to the first portions 210 of the first piezoelectric composite layer PCL1. For example, in the flexible vibration module 200 according to another embodiment of the present disclosure, the first portions 211 of the second piezoelectric composite layer PCL2 may respectively overlap the first portions 210 of the first piezoelectric composite layer PCL1 in a vertical direction. Thus, an expansive force (e.g., a tension) and a contractile force (e.g., a compressive force), each based on a bimorph structure, may increase, thereby enhancing a sound pressure characteristic.

For example, the first portions 211 of the second piezoelectric composite layer PCL2 may respectively overlap the second portions 220 of the first piezoelectric composite layer PCL1. For example, the first portions 211 of the second piezoelectric composite layer PCL2 may respectively correspond to the second portions 220 of the first piezoelectric composite layer PCL1. For example, in the flexible vibration module 200 according to another embodiment of the present disclosure, the first portions 211 of the second piezoelectric composite layer PCL2 and the first portions 210 of the first piezoelectric composite layer PCL1 may be alternately disposed in a vertical direction. Thus, the first portions 210 and 211 having a piezoelectric characteristic may be in parallel, and may not be spaced apart from one another. Accordingly, a whole area of the flexible vibration module 200 according to another embodiment of the present disclosure may vibrate, and a sound reproduction band based on the use of a wide area may increase. Each of the plurality of second portions 221 of the second piezoelectric composite layer PCL2 may include an organic material portion having flexibility, and may be the same as the second portions 220 of the first piezoelectric composite layer PCL1.

The third electrode layer 231 may be on a first surface (e.g., a front surface) of the second piezoelectric composite layer PCL2, and may be electrically connected to a first surface of each of the plurality of first portions 211 of the second piezoelectric composite layer PCL2. The third electrode layer 231 according to an embodiment may include a transparent conductive material, a semitransparent conductive material, or an opaque conductive material.

The fourth electrode layer 241 may be between the insulation layer 270 and the second piezoelectric composite layer PCL2, and may be electrically connected to a second surface (e.g., a rear surface) opposite to the first surface of each of the plurality of first portions 211 of the second piezoelectric composite layer PCL2. The fourth electrode layer 241 according to an embodiment may include a transparent conductive material, a semitransparent conductive material, or an opaque conductive material. For example, the fourth electrode layer 241 may include the same material as that of the first electrode layer 230.

The first electrode layer 230 and the second electrode layer 240 may receive a first electrical signal for vibrating the first piezoelectric composite layer PCL1. Also, the third electrode layer 231 and the fourth electrode layer 241 may receive a second electrical signal for vibrating the second piezoelectric composite layer PCL2. For example, the first electrical signal and the second electrical signal may have the same phase or opposite phases.

As another example, in the flexible vibration module 200 according to the present embodiment, the insulation layer 270 and the fourth electrode layer 241 may be omitted. For example, the first electrode layer 230 may be used as a common electrode (e.g., a shared electrode) of the first piezoelectric composite layer PCL1 and the second piezoelectric composite layer PCL2. For example, a polarization direction of each of the first portions 210 in the first piezoelectric composite layer PCL1 may be a direction opposite to a polarization direction of each of the first portions 211 in the second piezoelectric composite layer PCL2. Also, the first electrode layer 230 may be electrically connected to the first surface of each of the first portions 210 of the first piezoelectric composite layer PCL1, and may be electrically connected to the second surface of each of the first portions 211 of the second piezoelectric composite layer PCL2. Furthermore, the second electrode layer 240 and the third electrode layer 231 may be electrically connected to each other, or may receive the same electrical signal.

The flexible vibration module 200 according to another embodiment of the present disclosure may further include a first protection film 250 and a second protection film 260. The first protection film 250 may be on the third electrode layer 231, and may protect the first surface of the second piezoelectric composite layer PCL2 or the third electrode layer 231. For example, the first protection film 250 may be a polyimide (PI) film or a polyethyleneterephthalate (PET) film, but embodiments are not limited thereto.

The second protection film 260 may be on the second electrode layer 240, and may protect the second surface of the first piezoelectric composite layer PCL1 or the second electrode layer 240. For example, the second protection film 260 may be a polyimide (PI) film or a polyethyleneterephthalate (PET) film, but embodiments are not limited thereto.

The flexible vibration module 200 according to another embodiment of the present disclosure may have a bimorph shape, based on the first piezoelectric composite layer PCL1 and the second piezoelectric composite layer PCL2. Thus, the flexible vibration module 200 may sufficiently vibrate a display panel in a vertical (e.g., front-to-rear) direction, thereby enhancing a sound pressure characteristic based on a vibration of the display panel.

Figure 14:
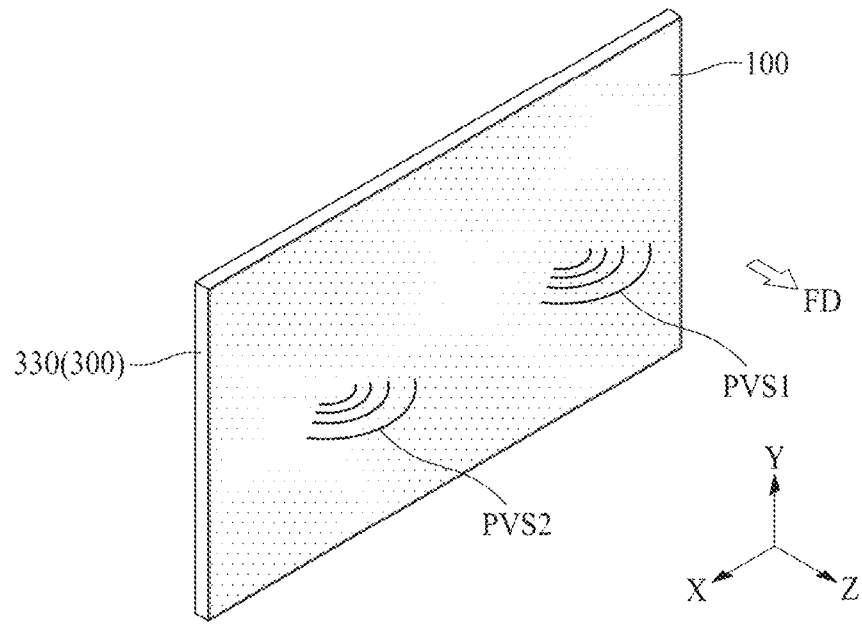
FIG. 14 is a perspective view of a display apparatus according to another embodiment of the present disclosure.
Figure 15:
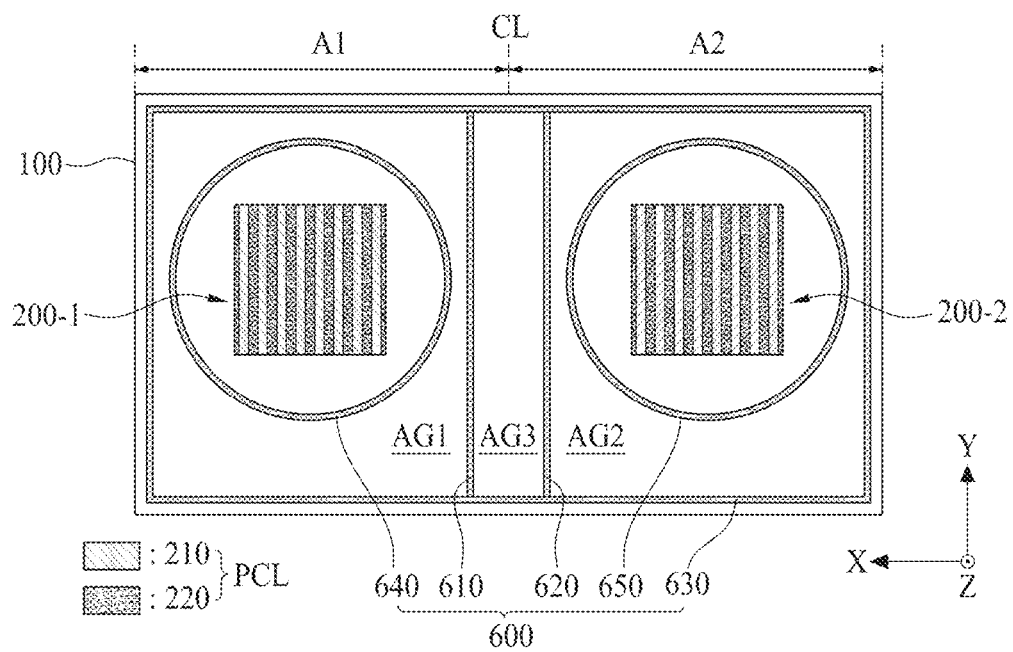
FIG. 15 is a diagram illustrating first and second vibration modules on a rear surface of a display panel illustrated in FIG. 14.

FIG. 14 is a perspective view of a display apparatus according to another embodiment of the present disclosure. FIG. 15 is a diagram illustrating first and second vibration modules on a rear surface of a display panel illustrated in FIG. 14.

FIGS. 14 and 15 illustrate an embodiment implemented by modifying the flexible vibration module of the display apparatus illustrated in FIG. 1. Hereinafter, therefore, repetitive descriptions of elements other than the first and second vibration modules are omitted or will be briefly given.

With reference to FIGS. 14 and 15, a flexible vibration module of a display apparatus according to another embodiment of the present disclosure may include a first vibration module 200-1 and a second vibration module 200-2, each disposed on a rear surface of a display panel 100. The rear surface (e.g., a back surface) of the display panel 100 may include first and second regions A1 and A2. For example, the rear surface (e.g., the back surface) of the display panel 100 may be divided into the first and second regions A1 and A2. For example, in the rear surface of the display panel 100, the first region A1 may be a left region, and the second region A2 may be a right region. The terms "left" and "right" are used herein for convenience of explanation, and are interchangeable as should be understood by one of ordinary skill in the art. The first and second regions A1 and A2 may be laterally symmetrical with respect to a center line CL of the display panel 100 in a first direction X.

The first vibration module 200-1 may be in the first region A1 of the display panel 100. The first vibration module 200-1 may vibrate the first region A1 of the display panel 100 to generate a first panel vibration sound PVS1 or a first haptic feedback in the first region A1 of the display panel 100. For example, the first panel vibration sound PVS1 may be a left sound.

The first vibration module 200-1 may be close to a center portion or an edge (e.g., a periphery) of the display panel 100 in the first region A1 of the display panel 100 with respect to the first direction X. For example, the first vibration module 200-1 may be close to a first partition member 610 or a third partition member 630. A size of the first vibration module 200-1 may have a size greater than or equal to half of the first region A1, but embodiments are not limited thereto. For example, the size may be set based on a sound characteristic desired for the display apparatus.

The second vibration module 200-2 may be in the second region A2 of the display panel 100. The second vibration module 200-2 may vibrate the second region A2 of the display panel 100 to generate a second panel vibration sound PVS2 or a second haptic feedback in the second region A2 of the display panel 100. For example, the second panel vibration sound PVS2 may be a right sound.

The second vibration module 200-2 may be close to a center portion or an edge (e.g., a periphery) of the display panel 100 in the second region A2 of the display panel 100 with respect to the first direction X. For example, the second vibration module 200-2 may be close to the second partition member 620 or the third partition member 630. A size of the second vibration module 200-2 may have a size greater than or equal to half of the second region A2, but embodiments are not limited thereto. For example the size may be set based on a sound characteristic desired for the display apparatus.

Each of the first and second vibration modules 200-1 and 200-2 according to an embodiment may include a piezoelectric composite layer PCL that may include a plurality of first portions 210 that have a line shape and are spaced apart from one another, and a plurality of second portions 220, each disposed between the plurality of first portions 210. This may be substantially similar to the flexible vibration module 200 illustrated in FIGS. 3 to 9. Thus, repetitive descriptions are omitted. For example, each of the first and second vibration modules 200-1 and 200-2 may be configured as one of the flexible vibration modules 200 according to any of the first to fourth embodiments of the present disclosure.

The display apparatus according to an embodiment of the present disclosure may further include a partition 600 for dividing the first and second regions A1 and A2 of the display panel 100. The partition 600 may be an air gap or a space where a sound is generated when the display panel 100 vibrates by the first and second vibration modules 200-1 and 200-2. An air gap or a space that generates or transfers a sound may be referred to as a "partition." A partition 600 may separate a sound or a channel, and may prevent or reduce generation of a sound that is not clear and is caused by sound interference. The partition 600 may be referred to as an "enclosure" or a "baffle," but the term is not limited thereto. The partition 600 according to an embodiment may include first and second partition members 610 and 620 between the first and second vibration modules 200-1 and 200-2.

The first and second partition members 610 and 620 may be between the display panel 100 and a rear structure 300 corresponding to the display panel 100. The first and second partition members 610 and 620 may separate the first panel vibration sound PVS1 and the second panel vibration sound PVS2 respectively generated by the first vibration module 200-1 and the second vibration module 200-2. For example, the first and second partition members 610 and 620 may reduce, block, or prevent the transfer of a vibration, generated by the first vibration module 200-1 in the first region A1 of the display panel 100, to the second region A2 of the display panel 100, or may reduce, block, or prevent the transfer of a vibration, generated by the second vibration module 200-2 in the second region A2 of the display panel 100, to the first region A1 of the display panel 100. Therefore, the first and second partition members 610 and 620 may attenuate or absorb a vibration of the display panel 100 at a center of the display panel 100. Thus, the first and second partition members 610 and 620 may reduce, block, or prevent the transfer of a sound of the first region A1 to the second region A2, or may reduce, block, or prevent the transfer of a sound of the second region A2 to the first region A1. Accordingly, the first and second partition members 610 and 620 may separate a left sound and a right sound to further enhance a sound output characteristic of the display apparatus. Thus, the display apparatus according to the present embodiment may separate the left and right sounds by using the first and second partition members 610 and 620 to output a two-channel stereo sound to a forward region in front of the display panel 100.

For example, the partition 600 may include polyurethane, polyolefin, and/or the like, but embodiments are not limited thereto. As another example, the partition 600 may include a double-sided adhesive tape or a single-sided adhesive tape. For example, the partition 600 may include a material having an elastic force that enables compression to be made to some degree.

As another example, one of the first and second partition members 610 and 620 may be omitted. For example, when the second partition member 620 of the first and second partition members 610 and 620 is omitted, the first partition member 610 may be between the display panel 100 and the rear structure 300 to correspond to a rear center line CL of the display panel 100. For example, even when one of the first and second partition members 610 and 620 is between the first vibration module 200-1 and the second vibration module 200-2, a left sound and a right sound may be separated from each other.

Therefore, the first and second partition members 610 and 620 may separate a left sound and a right sound to further enhance a sound output characteristic of the display apparatus. A display apparatus including the first partition member 610 or the second partition member 620 may separate the left and right sounds by using the first partition member 610 or the second partition member 620 to output a two-channel stereo sound to the forward region in front of the display panel 100.

The partition 600 according to an embodiment may further include a third partition member 630 between the display panel 100 and the rear structure 300. The third partition member 630 may be disposed along a space between a rear edge (e.g., a rear periphery) of the display panel 100 and a front edge (e.g., a front periphery) of the rear structure 300 to surround all of the first and second vibration modules 200-1 and 200-2. The third partition member 630 may be referred to as an "edge partition," a "sound blocking member," an "edge enclosure," or a "baffle," but the term is not limited thereto. For example, the third partition member 300 may be adjacent to or in contact with the panel fixing member 400 illustrated in FIG. 2, and may be surrounded by the panel fixing member 400. As another example, the third partition member 630 may be integrated as one body with the panel fixing member 400.

The third partition member 630 may provide first to third air gaps AG1 to AG3 between the display panel 100 and the rear structure 500, along with the first and second partition members 610 and 620. For example, each of the first to third air gaps AG1 to AG3 may be referred to as a "vibration space," a "sound pressure space," a "sound box," a "sound part," a "resonance box," or a "resonance part," but the term is not limited thereto.

The first air gap AG1 may be in the first region A1 of the display panel 100, and may be surrounded by the first partition member 610 and the third partition member 630 in the first region A1 of the display panel 100. The second air gap AG2 may be in the second region A2 of the display panel 100, and may be surrounded by the second partition member 620 and the third partition member 630 in the second region A2 of the display panel 100.

The third air gap AG3 may be in a third region (e.g., a center region) of the display panel 100 surrounded by the first and second partition members 610 and 630 and the third partition member 630. For example, the third air gap AG3 may be between the second air gap AG2 and the first air gap AG1, including the rear center line CL of the display panel 100. The third air gap AG3 may be referred to as a "sound separation space," a "sound blocking space," or a "sound interference prevention space," but the term is not limited thereto. The third air gap AG3 may spatially separate the first air gap AG1 from the second air gap AG2. Thus, the third air gap AG3 may reduce or prevent a resonance phenomenon or an interference phenomenon that may occur in each of the first air gap AG1 and the second air gap AG2, and may correspond to a certain frequency band.

The first vibration module 200-1 may be surrounded by the first partition member 610 and the third partition member 630 providing the first air gap AG1. The second vibration module 200-2 may be surrounded by the second partition member 620 and the third partition member 630 providing the second air gap AG2. When one of the first and second partition members 610 and 620 is omitted, the third air gap AG3 may be omitted.

Therefore, the third partition member 630 may surround an area between the display panel 100 and the rear structure 300, and may individually surround each of the first and second vibration modules 200-1 and 200-2, along with the first and second partition members 610 and 620, to secure a vibration space of each of the first and second vibration modules 200-1 and 200-2. Thus, the third partition member 630 may enhance a sound pressure characteristic of left and right sounds, and may reduce or prevent sound or a sound pressure from being leaked to the outside through the side surface between the display panel 100 and the rear structure 300, thereby further enhancing a sound output characteristic of the display apparatus.

The partition 600 according to an embodiment may further include a fourth partition member 640 surrounding the first vibration module 200-1, and a fifth partition member 650 surrounding the second vibration module 200-2. The fourth partition member 640 may be between the display panel 100 and the rear structure 300 to correspond to the first air gap AG1, and may individually (e.g., independently) surround the first vibration module 200-1. The fourth partition member 640 according to an embodiment may have a circular shape surrounding the first vibration module 200-1, but embodiments are not limited thereto. For example, the fourth partition member 640 may have a shape that is the same as or different from a whole shape of the first vibration module 200-1. For example, when the first partition member 200-1 has a rectangular shape, the fourth partition member 640 may have a rectangular shape having a size that is relatively greater than that of the first vibration module 200-1.

The fourth partition member 640 may limit (or define) a vibration region (e.g., a vibration area) of the display panel 100 based on the first vibration module 200-1. For example, in the first region A1 of the display panel 100, as a size of the fourth partition member 640 increases, a vibration region of the first region A1 may increase. Thus, a low-pitched sound band characteristic of a left sound may be enhanced. On the other hand, in the first region A1 of the display panel 100, as a size of the fourth partition member 640 decreases, the vibration region of the first region A1 may decrease. Thus, a high-pitched sound band characteristic of the left sound may be enhanced. Accordingly, a size of the fourth partition member 640 may be set based on a desired characteristic of a sound band, based on a vibration of the display panel 100.

The fifth partition member 650 may be between the display panel 100 and the rear structure 300 to correspond to the second air gap AG2, and may individually (e.g., independently) surround the second vibration module 200-2. For a left sound to be symmetrical with a right sound, the fifth partition member 650 may have the same shape as that of the fourth partition member 640 and a symmetrical structure with the fourth partition member 640 with respect to the rear center line CL of the display panel 100. Thus, description relevant thereto is omitted.

The fifth partition member 650 may limit (or define) a vibration region (e.g., a vibration area) of the display panel 100 based on the second vibration module 200-2. For example, in the second region A2 of the display panel 100, as a size of the fifth partition member 650 increases, a vibration region of the second region A2 may increase. Thus, the low-pitched sound band characteristic of the left sound may be enhanced. On the other hand, in the second region A2 of the display panel 100, as a size of the fifth partition member 650 decreases, the vibration region of the second region A2 may decrease. Thus, the high-pitched sound band characteristic of the left sound may be enhanced. Accordingly, a size of the fifth partition member 650 may be set based on a desired characteristic of a sound band, based on a vibration of the display panel 100.

The fourth and fifth partition members 640 and 650 may limit a vibration region (e.g., a vibration area) of each of the first and second vibration modules 200-1 and 200-2. Thus, the fourth and fifth partition members 640 and 650 may enhance lateral symmetricity of a left sound and a right sound each generated based on a vibration of the display panel 100, and may optimize a sound pressure characteristic and a sound reproduction band of each of the left and right sounds. As another example, when the fourth and fifth partition members 640 and 650 are provided, the third partition member 630 may be omitted. As another example, when the fourth and fifth partition members 640 and 650 are provided, one of the first to third partition members 610 to 630 may be omitted.

Therefore, when the display apparatus according to the present embodiment includes the partition 600, the sound pressure characteristic and the sound reproduction band of each of the left and right sounds may be improved or optimized. For example, the display apparatus according to the present embodiment may include at least one of the first and second partition members 610 and 620. As another example, the display apparatus according to the present embodiment may include the third partition member 630 and one of the first and second partition members 610 and 620. As another example, the display apparatus according to the present embodiment may include the third to fifth partition members 630, 640, and 650. As another example, the display apparatus according to the present embodiment may include the first to fifth partition members 610 to 650.

The display apparatus according to another embodiment of the present disclosure may output, through the first and second vibration modules 200-1 and 200-2, a left sound and a right sound to a forward region FD in front of the display panel 100 to provide a stereo sound to a user. Also, the display apparatus according to another embodiment of the present disclosure may separate the left and right sounds by using the partition 600 to output a two-channel stereo sound to the forward region FD in front of the display panel 100.

Figure 16:
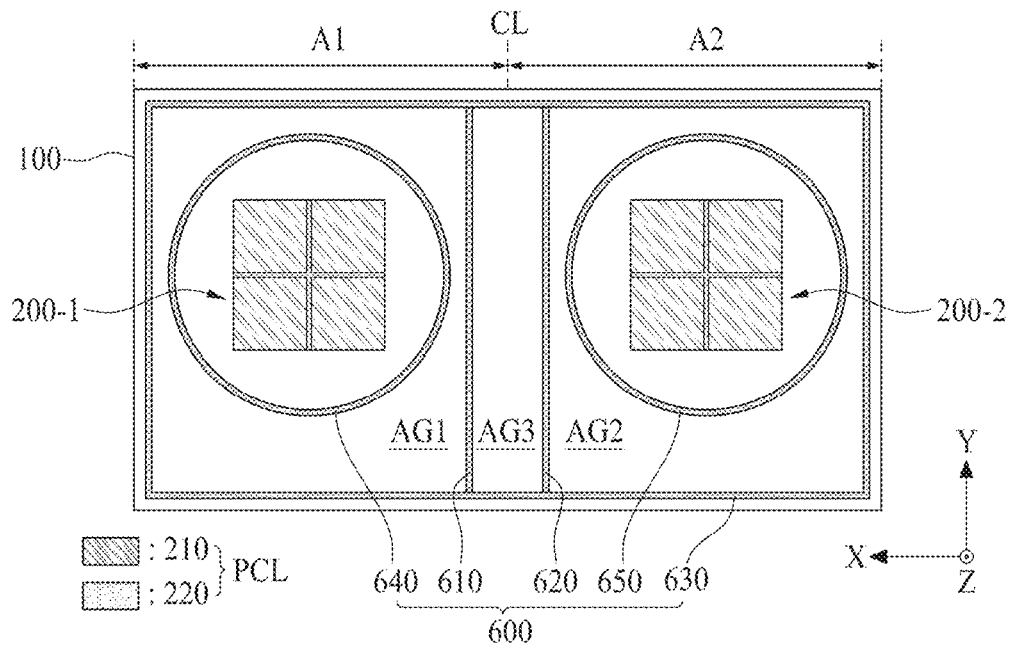
FIG. 16 is a diagram illustrating a first modification embodiment of each of first and second vibration modules illustrated in FIG. 15.

FIG. 16 is a diagram illustrating a first modification embodiment of each of first and second vibration modules illustrated in FIG. 15.

With reference to FIG. 16, each of first and second vibration modules 200-1 and 200-2 according to the first modification embodiment may include a piezoelectric composite layer PCL that may include a plurality of first portions 210 spaced apart from one another, and a plurality of second portions 220, each disposed between the plurality of first portions 210. Each of the plurality of first portions 210 may include an inorganic material portion having a vibration characteristic as described above. Thus, a repetitive description of the material is omitted.

The plurality of first portions 210 according to an embodiment may be disposed apart from one another in a first direction X and a second direction Y to each have a quadrilateral or tetragonal shape (e.g., a square shape). The plurality of first portions 210 may be adjacent to one another to form a quadrilateral or tetragonal shape (e.g., a square shape). According to another example, the plurality of first portions 210 may be disposed apart from one another in the first direction X and the second direction Y to each have a circular shape, as illustrated in the FIG. 10 example, or an oval shape or a donut shape.

Each of the plurality of first portions 210 according to another example may include 2N number of triangular patterns, where "N" is a natural number greater than or equal to 2, as illustrated in FIG. 11. The 2N triangular patterns may be adjacent to one another to form a 2N-angular shape. Vertices of the 2N triangular patterns forming the 2N-angular shape may be adjacent to one another in a center portion having the 2N-angular shape.

The second portions 220 may each be disposed or filled between two adjacent first portions of the plurality of first portions 210. For example, each of the second portions 220 may have a "+"-shape disposed between four first portions 210 forming a quadrilateral or tetragonal shape (e.g., a square shape). The second portions 220 may each include an organic material portion having flexibility as described above. Thus, a repetitive description of the material is omitted. Each of the second portions 220 may provide flexibility between two adjacent first portions of the plurality of first portions 210. Thus, a shape of the piezoelectric composite layer PCL or a shape of each of the first and second vibration modules 200-1 and 200-2 may have various shapes, based on deformation occurring between two adjacent first portions of the plurality of first portions 210.

Each of the first and second vibration modules 200-1 and 200-2 may further include a first electrode layer, which may be on a first surface of the piezoelectric composite layer PCL, and may be electrically connected to a first surface of each of the plurality of first portions 210. Each of the first and second vibration modules 200-1 and 200-2 may further include a second electrode layer, which may be on a second surface opposite to the first surface of the piezoelectric composite layer PCL, and may be electrically connected to a second surface of each of the plurality of first portions 210. Also, each of the first and second vibration modules 200-1 and 200-2 may further include a first protection film covering the first electrode layer and a second protection film covering the second electrode layer. The first electrode layer, the second electrode layer, the first protection film, and the second protection film are as described above. Thus, their repetitive descriptions are omitted.

The display apparatus according to the present embodiment may further include a partition 600 between the display panel 100 and a rear structure 300. For example, the partition 600 may be substantially similar to the partition 600 described above with reference to FIG. 15. Thus, its repetitive description is omitted.

The display apparatus according to the present embodiment may output a left sound and a right sound through the first and second vibration modules 200-1 and 200-2 to provide a stereo sound to a user. Also, the display apparatus according to the present embodiment may separate the left and right sounds by using the partition 600 to output a two-channel stereo sound.

Figure 17:
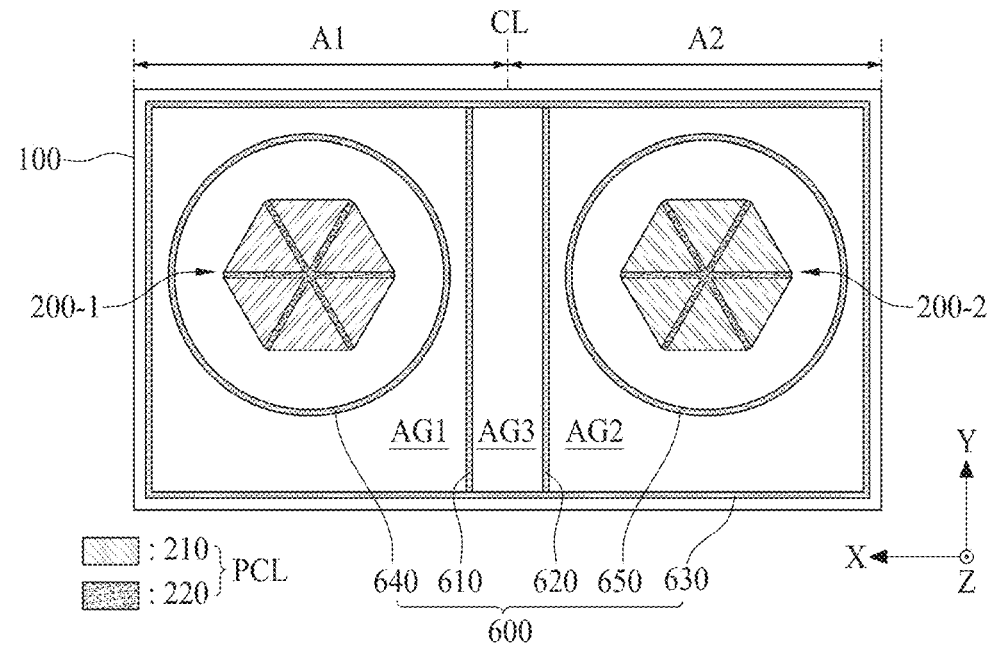
FIG. 17 is a diagram illustrating a second modification embodiment of each of first and second vibration modules illustrated in FIG. 15.

FIG. 17 is a diagram illustrating a second modification embodiment of each of first and second vibration modules illustrated in FIG. 15.

With reference to FIG. 17, each of first and second vibration modules 200-1 and 200-2 according to the second modification embodiment may include a piezoelectric composite layer PCL that may include a plurality of first portions 210 that may each have a triangular shape and may be spaced apart from one another, and a plurality of second portions 220, each disposed between the plurality of first portions 210. Each of the plurality of first portions 210 may include an inorganic material portion having a vibration characteristic as described above. Thus, a repetitive description of the material is omitted.

The plurality of first portions 210 according to an embodiment may be disposed apart from one another to form a hexagonal shape (e.g., a regularly hexagonal shape). Vertices of adjacent first portions 210 forming a hexagonal shape may be adjacent to one another in a center portion of the hexagonal shape.

The plurality of first portions 210 according to another example may be adjacent to one another to form a 2i-angular shape, where "i" is a natural number greater than or equal to 4. Vertices of adjacent first portions 210 forming the 2i-angular shape may be adjacent to one another in a center portion of the 2i-angular shape.

The second portions 220 may each be disposed or filled between two adjacent first portions of the plurality of first portions 210. For example, each of the second portions 220 may have a "*"-shape between six first portions 210 forming a hexagonal shape (e.g., a regularly hexagonal shape). The second portions 220 may each include an organic material portion having flexibility as described above. Thus, its repetitive description is omitted. Each of the second portions 220 may provide flexibility between two adjacent first portions of the plurality of first portions 210. Thus, a shape of the piezoelectric composite layer PCL or a shape of each of the first and second vibration modules 200-1 and 200-2 may have various shapes, based on deformation occurring between two adjacent first portions of the plurality of first portions 210.

The plurality of first portions 210 having a triangular shape may be adjacent to one another to have a 2j-angular shape, where "j" is a natural number greater than or equal to 3. Thus, the piezoelectric composite layer PCL of each of the first and second vibration modules 200-1 and 200-2 may be implemented as a vibration source (e.g., a vibration body) which may be approximately circular in shape, thereby enhancing a vibration characteristic.

Each of the first and second vibration modules 200-1 and 200-2 may further include a first electrode layer, which may be on a first surface of the piezoelectric composite layer PCL, and may be electrically connected to a first surface of each of the plurality of first portions 210. Each of the first and second vibration modules 200-1 and 200-2 may further include a second electrode layer, which may be on a second surface opposite to the first surface of the piezoelectric composite layer PCL, and may be electrically connected to a second surface of each of the plurality of first portions 210. Also, each of the first and second vibration modules 200-1 and 200-2 may further include a first protection film covering the first electrode layer and a second protection film covering the second electrode layer. The first electrode layer, the second electrode layer, the first protection film, and the second protection film are as described above. Thus, their repetitive descriptions are omitted.

The display apparatus according to the present embodiment may further include a partition 600 between the display panel 100 and the rear structure 300. For example, the partition 600 may be substantially similar to the partition 600 described above with reference to FIG. 15. Thus, its repetitive description is omitted. The fourth and fifth partition members 640 and 650 illustrated in FIG. 17 may each have the same hexagonal shape as that of each of the first and second vibration modules 200-1 and 200-2.

The display apparatus according to the present embodiment may output a left sound and a right sound through the first and second vibration modules 200-1 and 200-2 to provide a stereo sound to a user. Also, the display apparatus according to the present embodiment may output sounds through the first and second vibration modules 200-1 and 200-2, which may be approximately circular in shape, thereby enhancing a sound characteristic. Also, the display apparatus according to the present embodiment may separate the left and right sounds by using the partition 600 to output a two-channel stereo sound.

Figure 18:
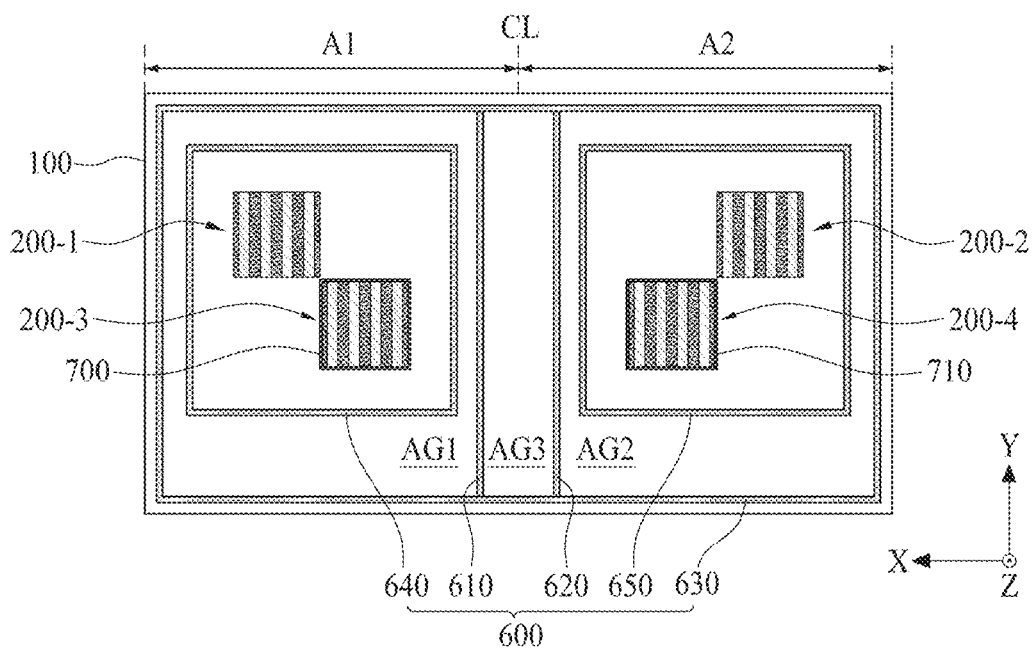
FIG. 18 is a diagram illustrating an example of each of first to fourth vibration modules on the rear surface of the display panel illustrated in FIG. 14.

FIG. 18 is a diagram illustrating an example of each of first to fourth vibration modules on the rear surface of the display panel illustrated in FIG. 14.

FIG. 18 illustrates an embodiment implemented by modifying the flexible vibration module illustrated in FIG. 1. Hereinafter, therefore, repetitive descriptions of elements, other than the first to fourth vibration modules, are omitted or will be briefly given.

With reference to FIG. 18 in conjunction with FIG. 14, a flexible vibration module of a display apparatus according to another embodiment of the present disclosure may include first to fourth vibration modules 200-1 to 200-4 on a rear surface of a display panel 100. The rear surface (e.g., a back surface) of the display panel 100 may include first and second regions A1 and A2. For example, the rear surface (e.g., the back surface) of the display panel 100 may be divided into the first and second regions A1 and A2. For example, in the rear surface of the display panel 100, the first region A1 may be a left region, and the second region A2 may be a right region. The first and second regions A1 and A2 may be laterally symmetrical with respect to a center line CL of the display panel 100 in a first direction X.

The first and third vibration modules 200-1 and 200-3 may be alternately or diagonally disposed in the first region A1 of the display panel 100. Thus, the first and third vibration modules 200-1 and 200-3 may increase a vibration area of the first region A1 of the display panel 100. For example, in addition to the first vibration module 200-1, the third vibration module 200-3 may be further provided. Thus, a first panel vibration sound PVS1 may be further enhanced. Each of the first and third vibration modules 200-1 and 200-3 may vibrate the first region A1 of the display panel 100 to generate the first panel vibration sound PVS1 or a first haptic feedback in the first region A1 of the display panel 100. For example, the first panel vibration sound PVS1 may be a left sound. For example, a vibration area of the first region A1 of the display panel 100 may increase based on a diagonal arrangement structure of the first and third vibration modules 200-1 and 200-3. Thus, a low-pitched sound band characteristic of the left sound may be enhanced.

The first and third vibration modules 200-1 and 200-3 may be in parallel in the first direction X or a second direction Y in the first region A1 of the display panel 100. For example, the vibration area of the first region A1 of the display panel 100 may increase based on a parallel arrangement structure of the first and third vibration modules 200-1 and 200-3, thereby enhancing the low-pitched sound band characteristic of the left sound. Comparing with the parallel arrangement structure of the first and third vibration modules 200-1 and 200-3, the diagonal arrangement structure of the first and third vibration modules 200-1 and 200-3 may further increase the vibration area of the first region A1 of the display panel 100, thereby enhancing the low-pitched sound band characteristic of the left sound. The diagonal arrangement structure of the first and third vibration modules 200-1 and 200-3 may have an effect in which vibration modules may be disposed in a 2×2 structure in the first region A1 of the display panel 100. Thus, the number of vibration modules for vibrating the first region A1 of the display panel 100 may decrease by half.

The second and fourth vibration modules 200-2 and 200-4 may be alternately or diagonally disposed in the second region A2 of the display panel 100. Thus, the second and fourth vibration modules 200-2 and 200-4 may increase a vibration area of the second region A2 of the display panel 100. For example, in addition to the second vibration module 200-2, the fourth vibration module 200-4 may be further provided. Thus, a second panel vibration sound PVS2 may be further enhanced. Each of the second and fourth vibration modules 200-2 and 200-4 may vibrate the second region A2 of the display panel 100 to generate the second panel vibration sound PVS2 or a second haptic feedback in the second region A2 of the display panel 100. For example, the second panel vibration sound PVS2 may be a right sound. For example, a vibration area of the second region A2 of the display panel 100 may increase based on a diagonal arrangement structure of the second and fourth vibration modules 200-2 and 200-4. Thus, a low-pitched sound band characteristic of the right sound may be enhanced.

The second and fourth vibration modules 200-2 and 200-4 may be in parallel in the first direction X or a second direction Y in the second region A2 of the display panel 100. For example, the vibration area of the second region A2 of the display panel 100 may increase based on a parallel arrangement structure of the second and fourth vibration modules 200-2 and 200-4, thereby enhancing the low-pitched sound band characteristic of the left sound. Comparing with the parallel arrangement structure of the second and fourth vibration modules 200-2 and 200-4, the diagonal arrangement structure of the second and fourth vibration modules 200-2 and 200-4 may further increase the vibration area of the second region A2 of the display panel 100, thereby enhancing the low-pitched sound band characteristic of the left sound. The diagonal arrangement structure of the second and fourth vibration modules 200-2 and 200-4 may have an effect in which vibration modules may be disposed in a 2×2 structure in the second region A2 of the display panel 100. Thus, the number of vibration modules for vibrating the second region A2 of the display panel 100 may decrease by half.

The first vibration module 200-1 may be in the first region A1 of the display panel 100. As another example, the first vibration module 200-1 may be close to an edge or a periphery of the display panel 100 in the first region A1 of the display panel 100 with respect to the first direction X. For example, the first vibration module 200-1 may be between a center portion and the edge or the periphery of the display panel 100 in the first region A1 of the first vibration module 200-1. For example, the first vibration module 200-1 may be in a left upper region adjacent to an edge or a periphery of the display panel 100 in the first region A1 of the display panel 100 with respect to the first direction X.

The third vibration module 200-3 may be in the first region A1 of the display panel 100. As another example, the third vibration module 200-3 may be close to a center line CL of the display panel 100 in the first region A1 of the display panel 100 with respect to the first direction X. The third vibration module 200-3 according to an embodiment may be between the center line CL of the display panel 100 and a center portion of the first region A1. For example, the third vibration module 200-3 may be in a right lower region adjacent to the center line CL of the display panel 100 in the first region A1 of the display panel 100 with respect to the first direction X. The third vibration module 200-3 may be disposed alternately with respect to the first vibration module 200-1 in the first region A1 of the display panel 100. Thus, the third vibration module 200-3 may not overlap the first vibration module 200-1 in the first direction X and the second direction Y.

The second vibration module 200-2 may be in the second region A2 of the display panel 100. As another example, the second vibration module 200-2 may be close to an edge or a periphery of the display panel 100 in the second region A2 of the display panel 100 with respect to the first direction X. The second vibration module 200-2 according to an embodiment may be between a center portion and the edge or the periphery of the display panel 100 in the second region A2 of the second vibration module 200-2. For example, the second vibration module 200-2 may be in a right upper region adjacent to an edge or a periphery of the display panel 100 in the second region A2 of the display panel 100 with respect to the first direction X. Also, the first vibration module 200-1 may be laterally symmetrical with the second vibration module 200-2 with respect to the center line CL of the display panel 100.

The fourth vibration module 200-4 may be in the second region A2 of the display panel 100. As another example, the fourth vibration module 200-4 may be close to the center line CL of the display panel 100 in the second region A2 of the display panel 100 with respect to the first direction X. The fourth vibration module 200-4 according to an embodiment may be between the center line CL of the display panel 100 and a center portion of the second region A2. For example, the fourth vibration module 200-4 may be in a left lower region adjacent to the center line CL of the display panel 100 in the second region A2 of the display panel 100 with respect to the first direction X. The fourth vibration module 200-4 may be disposed alternately with respect to the second vibration module 200-2 in the second region A2 of the display panel 100. Thus, the fourth vibration module 200-4 may not overlap the second vibration module 200-2 in the first direction X and the second direction Y Also, the third vibration module 200-3 may be laterally symmetrical with the fourth vibration module 200-4 with respect to the center line CL of the display panel 100.

Each of the first to fourth vibration modules 200-1 to 200-4 may further include a first electrode layer, which may be on a first surface of the piezoelectric composite layer PCL, and may be electrically connected to a first surface of each of the plurality of first portions 210. Each of the first to fourth vibration modules 200-1 to 200-4 may further include a second electrode layer, which may be on a second surface of the piezoelectric composite layer PCL, opposite to the first surface, and may be electrically connected to a second surface of each of the plurality of first portions 210. Also, each of the first to fourth vibration modules 200-1 to 200-4 may further include a first protection film covering the first electrode layer and a second protection film covering the second electrode layer. The first electrode layer, the second electrode layer, the first protection film, and the second protection film are as described above. Thus, their repetitive descriptions are omitted.

The display apparatus according to another embodiment of the present disclosure may further include a first plate 700 between the third vibration module 200-3 and the display panel 100, and a second plate 710 between the fourth vibration module 200-4 and the display panel 100. The first plate 700 may be coupled or connected to each of the third vibration module 200-3 and the display panel 100, e.g., by an adhesive member. The first plate 700 may transfer a vibration of the third vibration module 200-3 to the display panel 100. Also, the first plate 700 may reinforce the mass of the third vibration module 200-3 to decrease a resonance frequency of the third vibration module 200-3 based on the increase in mass. Thus, the first plate 700 may increase a sound pressure characteristic of a low-pitched sound band of the third vibration module 200-3, thereby enhancing flatness of a sound pressure characteristic based on a vibration of the display panel 100.

The second plate 710 may be coupled or connected to each of the fourth vibration module 200-4 and the display panel 100 by an adhesive member. The second plate 710 may transfer a vibration of the fourth vibration module 200-4 to the display panel 100. Also, the second plate 710 may reinforce the mass of the fourth vibration module 200-4 to decrease a resonance frequency of the fourth vibration module 200-4 based on the increase in mass. Thus, the second plate 710 may increase a pressure characteristic of a low-pitched sound band of the fourth vibration module 200-4, thereby enhancing flatness of a sound pressure characteristic based on a vibration of the display panel 100. Each of the first and second plates 700 and 710 according to an embodiment may include a material including one or more of: stainless steel, Al, a Mg alloy, a Mg—Li alloy, and an Al alloy, but embodiments are not limited thereto.

The display apparatus according to another embodiment of the present disclosure may further include a partition 600 between the display panel 100 and the rear structure 300. Except for that each of fourth and fifth partition members 640 and 650 has a quadrilateral or tetragonal shape, the partition 600 according to the present embodiment may be substantially similar to the partition 600 described above with reference to FIG. 15. Thus, its repetitive description is omitted. The fourth and fifth partition members 640 and 650 illustrated in FIG. 18 may each have a circular shape.

Therefore, the display apparatus according to another embodiment of the present disclosure may output a left sound and a right sound through the first and third vibration modules 200-1 and 200-3 in the first region A1 of the display panel 100 and the second and fourth vibration modules 200-2 and 200-4 disposed in the second region A2 of the display panel 100 to provide a stereo sound to a user. Also, in the display apparatus according to another embodiment of the present disclosure, a vibration area of the first region A1 based on the first and third vibration modules 200-1 and 200-3 in a diagonal direction and a vibration area of the second region A2 based on the second and fourth vibration modules 200-2 and 200-4 in a diagonal direction may increase. Thus, a pressure characteristic of a low-pitched sound band may increase, and a resonance frequency may be reduced by the first and second plates 700 and 710 respectively coupled or connected to the third and fourth vibration modules 200-3 and 200-4, thereby enhancing flatness of a sound pressure characteristic. Also, the display apparatus according to the present embodiment may separate the left and right sounds by using the partition 600 to output a two-channel stereo sound.

Figure 19A:
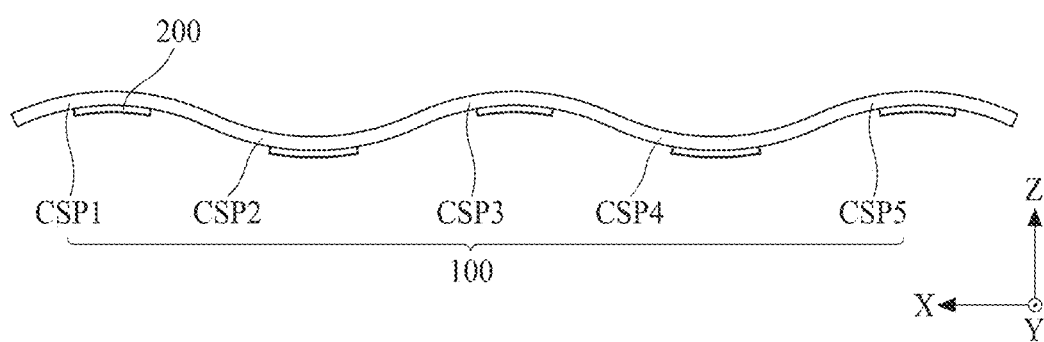
FIGS. 19A to 19C are diagrams illustrating various display apparatuses to which a flexible vibration module according to an embodiment of the present disclosure may be applied.
Figure 19B:
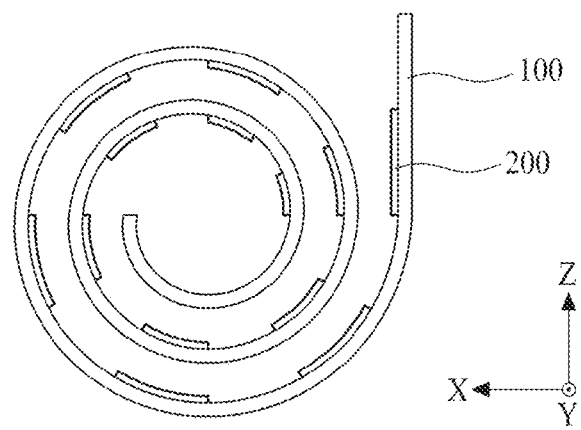
Figure 19C:
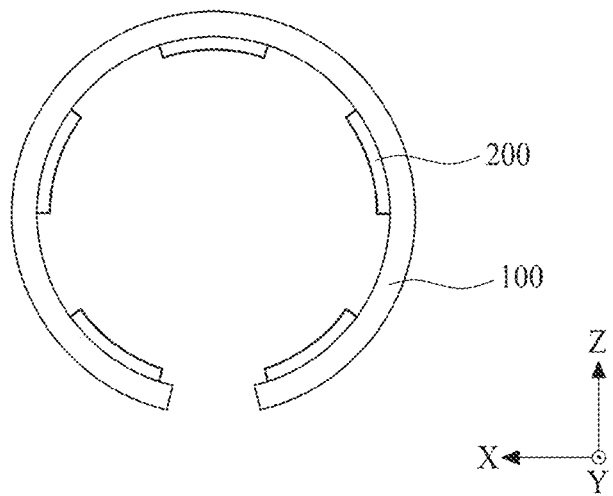

FIGS. 19A to 19C are diagrams illustrating various display apparatuses to which a flexible vibration module according to an embodiment of the present disclosure may be applied.

FIGS. 19A to 19C illustrate a display apparatus to which the flexible vibration module illustrated in any of FIGS. 4 to 13 may be applied. A flexible vibration module according to an embodiment of the present disclosure may be implemented as a film type having flexibility. Thus, embodiments may be applied to various application apparatuses.

With reference to FIG. 19A, a flexible vibration module 200 according to an embodiment of the present disclosure may be applied to a commercial display apparatus or to a flexible display apparatus including a display panel 100 including a plurality of curved surface portions CSP1 to CSP5 which may be concave or convex. For example, the flexible vibration module 200 may be implemented to be bent in a shape having a curvature value (e.g., a curvature radius) matching a convex portion or a concave portion of each of the curved surface portions CSP1 to CSP5 of the display panel 100, and may be in the convex portion or the concave portion of each of the curved surface portions CSP1 to CSP5 of the display panel 100. As another example, the flexible vibration module 200 may be implemented to have a shape matching the curvature value (e.g., the curvature radius) of each of the curved surface portions CSP1 to CSP5 of the display panel 100, and may be on an entire (or whole) rear surface of the display panel 100.

With reference to FIG. 19B, the flexible vibration module 200 according to an embodiment of the present disclosure may be applied to a rollable display apparatus, including a display panel 100 that may be wound in a spiral shape or unwound. For example, the flexible vibration module 200 according to an embodiment of the present disclosure may be implemented to have a shape having a curvature value (e.g., a curvature radius) of the display panel 100 that may be wound in a spiral shape or unwound, and a plurality of flexible vibration modules 200 may be arranged at certain intervals on a rear surface of the display panel 100. As another example, the flexible vibration module 200 may be implemented to have a shape matching the curvature value (e.g., the curvature radius) of the display panel 100, and may be on the entire rear surface of the display panel 100.

With reference to FIG. 19C, the flexible vibration module 200 according to an embodiment of the present disclosure may be applied to a wearable display apparatus including a display panel 100, which may be wound around a wrist of a user, and may be bent in a "C"-shape. For example, the flexible vibration module 200 according to an embodiment of the present disclosure may be implemented to have a shape having a curvature value (e.g., a curvature radius) of the display panel 100, which may be bent in the "C"-shape, and a plurality of flexible vibration modules 200 may be arranged at certain intervals on a rear surface of the display panel 100. As another example, the flexible vibration module 200 may be implemented to have a shape matching the curvature value (e.g., the curvature radius) of the display panel 100, which may be bent in the C-shape, and may be on the entire rear surface of the display panel 100.

Figure 20A:
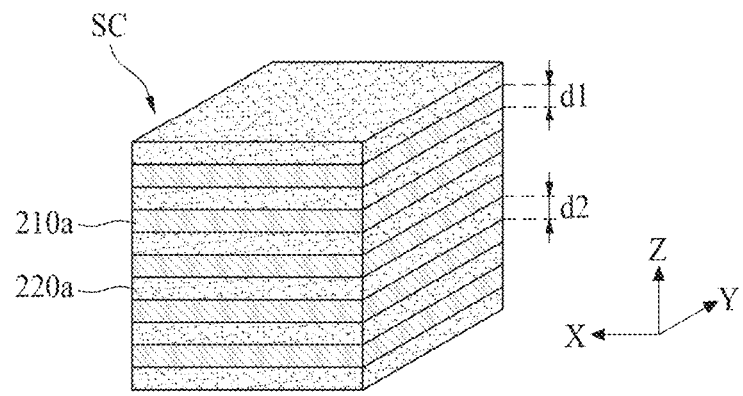
FIGS. 20A to 20C are diagrams illustrating a method of manufacturing a flexible vibration module according to an embodiment of the present disclosure.
Figure 20B:
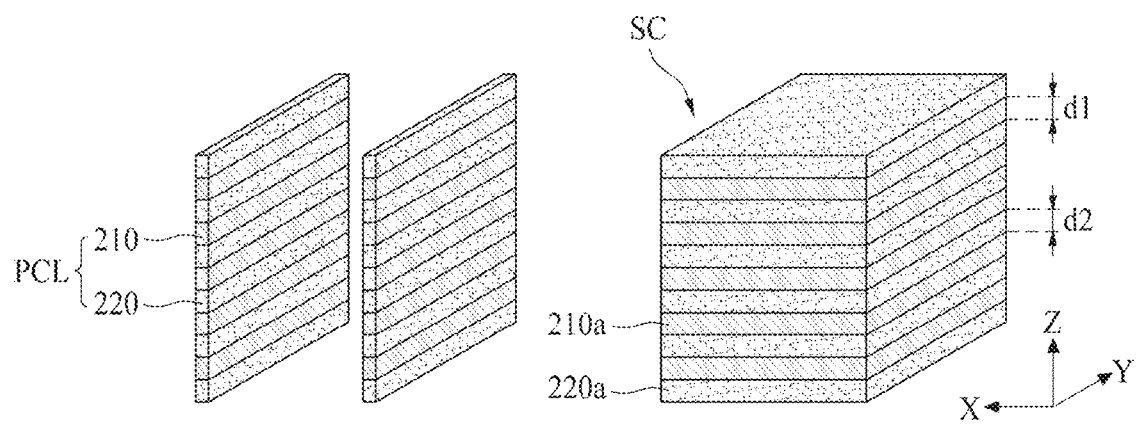
Figure 20C:
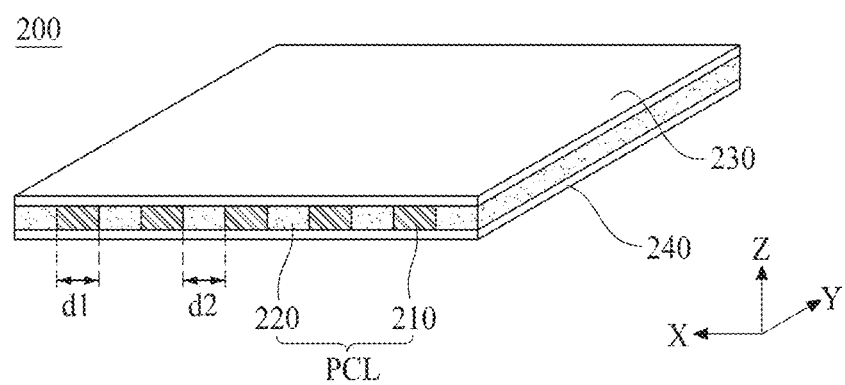

FIGS. 20A to 20C are diagrams illustrating a method of manufacturing a flexible vibration module according to an embodiment of the present disclosure.

FIGS. 20A to 20C illustrate a method of manufacturing the flexible vibration module according to an embodiment illustrated in any of FIGS. 4 to 8. Hereinafter, therefore, detailed descriptions of elements of the flexible vibration module are omitted. A method of manufacturing a flexible vibration module according to an embodiment of the present disclosure will be described below with reference to FIGS. 20A to 20C.

First, a plate-shaped inorganic material mother substrate 210a having a piezoelectric characteristic may be manufactured through a pre-process. The pre-process according to an embodiment may mix and dry ceramic raw materials, may crystallize a crystalline structure through a calcination (e.g., firing) process, and may manufacture the plate-shaped inorganic material mother substrate 210a by performing a molding process and a sintering process at least once. For example, the plate-shaped inorganic material mother substrate 210a may include a piezoelectric ceramic having a perovskite-based crystalline structure. The sintering process may use one or more of: heat, pressure, and spark plasma. The plate-shaped inorganic material mother substrate 210a may have a first width (e.g., thickness) d1.

Next, a piezoelectric composite layer PCL, including a plurality of inorganic material portions 210 and a plurality of organic material portions 220, each disposed between the plurality of inorganic material portions 210, may be manufactured by performing a post-process illustrated in FIGS. 20A and 20B based on the plate-shaped inorganic material mother substrate 210a and an organic material having flexibility. A method of manufacturing the piezoelectric composite layer PCL according to an embodiment will be described below.

As illustrated in FIG. 20A, a stacked composite SC, including a plurality of inorganic material mother substrates 210a and a plurality of organic material layers 220a, each disposed between the plurality of inorganic material mother substrates 210a, may be provided. For example, the stacked composite SC may be manufactured by repeatedly performing a process of forming the organic material layer 220a having a second width (e.g., thickness) d2 on the inorganic material mother substrate 210a and a process of placing another inorganic material mother substrate 210a on the organic material layer 220a. Next, the plurality of organic material layers 220a included in the stacked composite SC may be cured through a curing process.

Next, as illustrated in FIG. 20B, a film-type piezoelectric composite layer PCL, in which a plurality of inorganic material portions 210 cut from each of the plurality of inorganic material mother substrates 210a and a plurality of organic material portions 220 cut from each of the plurality of organic material layers 220a are alternately arranged, may be manufactured by cutting the stacked composite SC by units of certain sizes through a cutting process. For example, the cutting process may be performed by at least one of: a wire sawing process, a scribing process, a blade dicing process, a laser cutting process, a stealth dicing process, and a thermal laser separation (TLS) process, but embodiments are not limited thereto.

Next, as illustrated in FIG. 20C, a first electrode layer 230 may be formed on a first surface of the piezoelectric composite layer PCL, and a second electrode layer 240 may be formed on a second surface of the piezoelectric composite layer PCL, opposite to the first surface. Next, polarization of each of the plurality of inorganic material portions 210 in the piezoelectric composite layer PCL may be formed through a polarization process of applying a certain voltage to the first electrode layer 230 and the second electrode layer 240 in a certain temperature atmosphere or a temperature atmosphere that may be changed from a high temperature to a room temperature. Next, a pad connected to each of the first electrode layer 230 and the second electrode layer 240 may be formed, and a protection film covering the first electrode layer 230 and the second electrode layer 240 may be formed, thereby completing the post-process performed on the flexible vibration module.

In the method of manufacturing the flexible vibration module according to an embodiment of the present disclosure, the film type piezoelectric composite layer PCL may be manufactured by performing one-time cutting process on the stacked composite SC, including the plurality of inorganic material mother substrates 210a and the plurality of organic material layers 220a, each disposed between two adjacent inorganic material mother substrates of the plurality of inorganic material mother substrates 210a. This may simplify a process of manufacturing the piezoelectric composite layer PCL or shorten a time taken in a process of manufacturing the piezoelectric composite layer PCL.

FIGS. 21A to 21D are diagrams illustrating a method of manufacturing a flexible vibration module according to another embodiment of the present disclosure.

FIGS. 21A to 21D illustrate a method of manufacturing the flexible vibration module according to an embodiment illustrated in any of FIGS. 4 to 8. Hereinafter, therefore, detailed descriptions of elements of the flexible vibration module are omitted. A method of manufacturing a flexible vibration module according to another embodiment of the present disclosure will be described below with reference to FIGS. 21A to 21D.

First, a plate-shaped inorganic material mother substrate having a piezoelectric characteristic may be manufactured through a pre-process. The pre-process is substantially similar to the above description. Thus, its repetitive description is omitted.

Figure 21A:
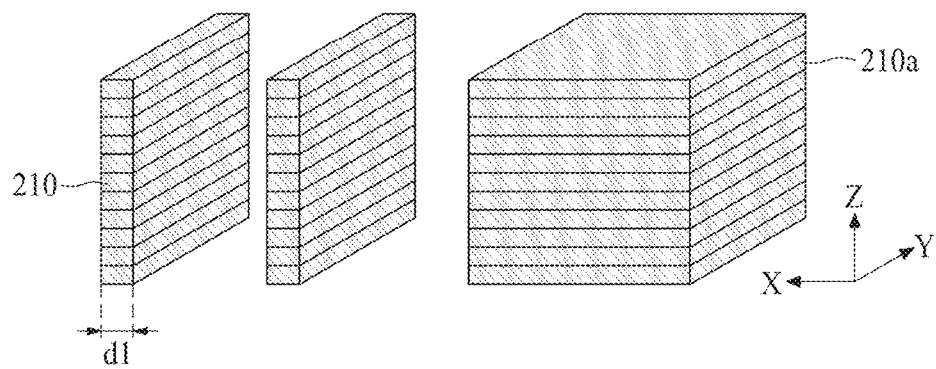
FIGS. 21A to 21D are diagrams illustrating a method of manufacturing a flexible vibration module according to another embodiment of the present disclosure.
Figure 21B:
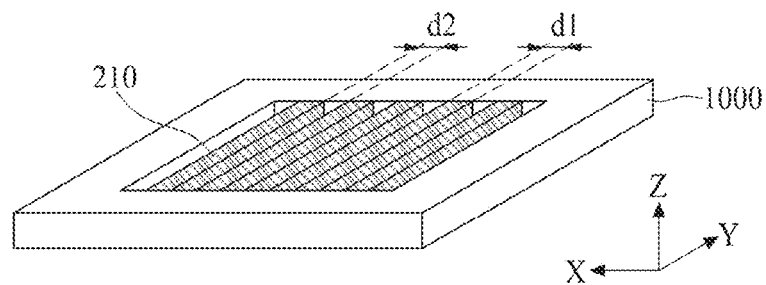
Figure 21C:
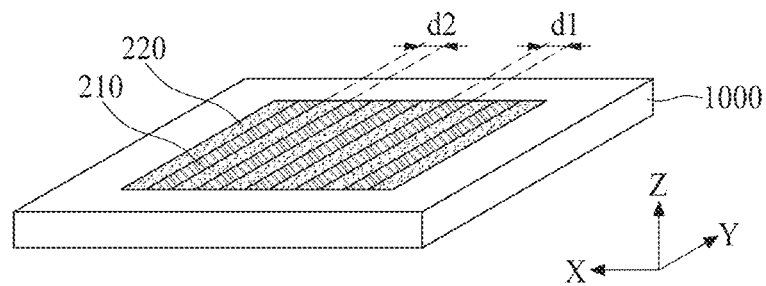

Next, a piezoelectric composite layer PCL including a plurality of inorganic material portions 210 and a plurality of organic material portions 220, each disposed between the plurality of inorganic material portions 210, may be manufactured by performing a post-process illustrated in FIGS. 21A to 21C based on the plate-shaped inorganic material mother substrate 210a and an organic material having flexibility. A method of manufacturing the piezoelectric composite layer PCL according to an embodiment will be described below.

As illustrated in FIG. 21A, the plurality of inorganic material mother substrates 210a may be sequentially stacked, and a plurality of inorganic material portions 210 (e.g., inorganic material bars) cut in a line shape from each of the plurality of inorganic material mother substrates 210a may be manufactured by simultaneously cutting the stacked plurality of inorganic material mother substrates 210a by units of certain first widths d1 through a cutting process. For example, the cutting process may be performed by at least one of: a wire sawing process, a scribing process, a blade dicing process, a laser cutting process, a stealth dicing process, and a thermal laser separation (TLS) process, but embodiments are not limited thereto.

Next, as illustrated in FIG. 21B, a frame 1000 (e.g., a tray), including an opening corresponding to a size of the flexible vibration module, may be on a stage. The plurality of inorganic material portions 210 may be arranged at a certain interval d2 in the opening of the frame 1000.

Next, as illustrated in FIG. 21C, an organic material may be filled between the plurality of inorganic material portions 210 in the opening of the frame 1000. Then, a plurality of organic material portions 220 having flexibility may be formed by curing the organic material through a curing process, thereby manufacturing a film type piezoelectric composite layer PCL in which the plurality of organic material portions 220 and the plurality of inorganic material portions 210 are alternately arranged along a first direction X. Next, an organic material remaining on the film type piezoelectric composite layer PCL may be removed, and the film type piezoelectric composite layer PCL, from which the organic material is removed, may be unloaded from the frame 1000.

Figure 21D:
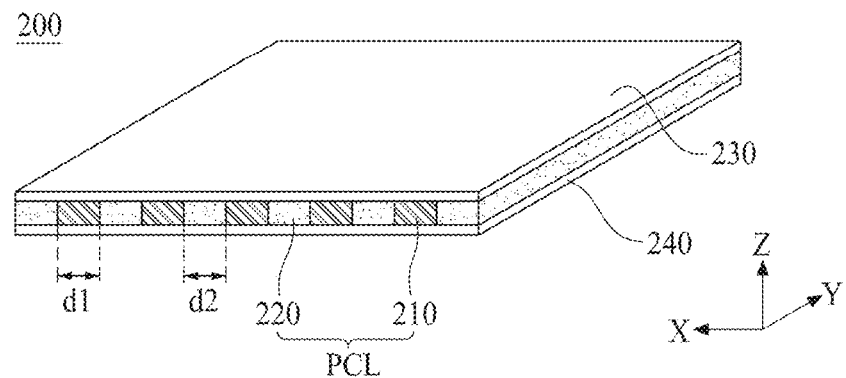

Next, as illustrated in FIG. 21D, a first electrode layer 230 may be formed on a first surface of the piezoelectric composite layer PCL, and a second electrode layer 240 may be formed on a second surface of the piezoelectric composite layer PCL, opposite to the first surface. Next, polarization of each of the plurality of inorganic material portions 210 in the piezoelectric composite layer PCL may be formed through a polarization process of applying a certain voltage to the first electrode layer 230 and the second electrode layer 240 in a certain temperature atmosphere or a temperature atmosphere that may be changed from a high temperature to a room temperature. Next, a pad connected to each of the first electrode layer 230 and the second electrode layer 240 may be formed, and a protection film covering the first electrode layer 230 and the second electrode layer 240 may be formed, thereby completing the post-process performed on the flexible vibration module. In the method of manufacturing the flexible vibration module according to another embodiment of the present disclosure, the film type piezoelectric composite layer PCL having various sizes may be manufactured by adjusting an interval or a distance between the plurality of inorganic material portions 210 in the opening of the frame 1000.

FIGS. 22A to 22F are diagrams illustrating a method of manufacturing a flexible vibration module according to another embodiment of the present disclosure.

FIGS. 22A to 22F illustrate a method of manufacturing the flexible vibration module illustrated in FIG. 11. Hereinafter, therefore, detailed descriptions of elements of the flexible vibration module are omitted. A method of manufacturing a flexible vibration module according to another embodiment of the present disclosure will be described below with reference to FIGS. 22A to 22F.

First, a plate-shaped inorganic material mother substrate having a piezoelectric characteristic may be manufactured through a pre-process. The pre-process is substantially similar to the above description. Thus, its repetitive description is omitted.

Next, a piezoelectric composite layer PCL including a plurality of inorganic material portions 210 and a plurality of organic material portions 200, each disposed between the plurality of inorganic material portions 210, may be manufactured by performing a post-process illustrated in FIGS. 22A to 22E based on a plate-shaped inorganic material mother substrate 210a and an organic material having flexibility. A method of manufacturing the piezoelectric composite layer PCL according to an embodiment will be described below.

Figure 22A:
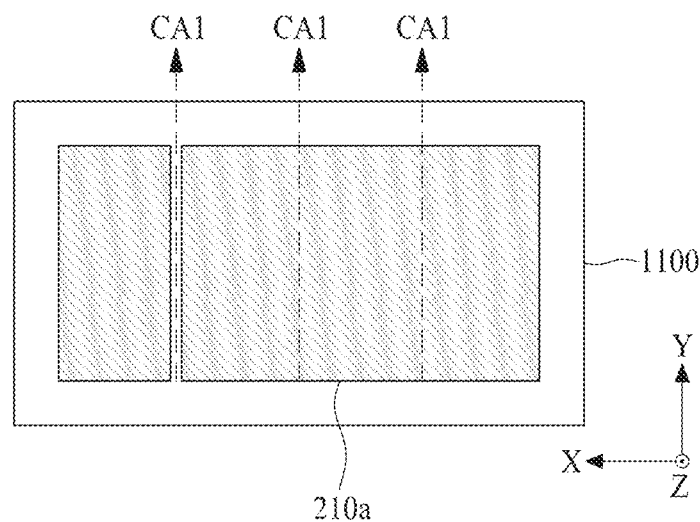
FIGS. 22A to 22F are diagrams illustrating a method of manufacturing a flexible vibration module according to another embodiment of the present disclosure.

As illustrated in FIG. 22A, a single inorganic material mother substrate 210a may be on a rotatable stage 1100, a cutting apparatus having a cutting path set in a second direction Y (e.g., a lengthwise direction) may be aligned on the stage 1100, and a first-order first cutting region CA1 of a plurality of first cutting regions CA1 (e.g., cutting regions in the lengthwise direction) previously set on the inorganic material mother substrate 210a may be aligned on a cutting path of the cutting apparatus by rotating and moving the stage 1100. Next, the single inorganic material mother substrate 210a may be separated into a plurality of inorganic material mother substrates 210a in the lengthwise direction by sequentially cutting each of the first cutting regions CA1 of the inorganic material mother substrate 210a aligned on the cutting path through a first cutting process performed by the cutting apparatus and the rectilinear movement of the stage 1100. For example, the single inorganic material mother substrate 210a may be separated (e.g., patterned) into four inorganic material mother substrates 210a through a three-part first cutting process.

Figure 22B:
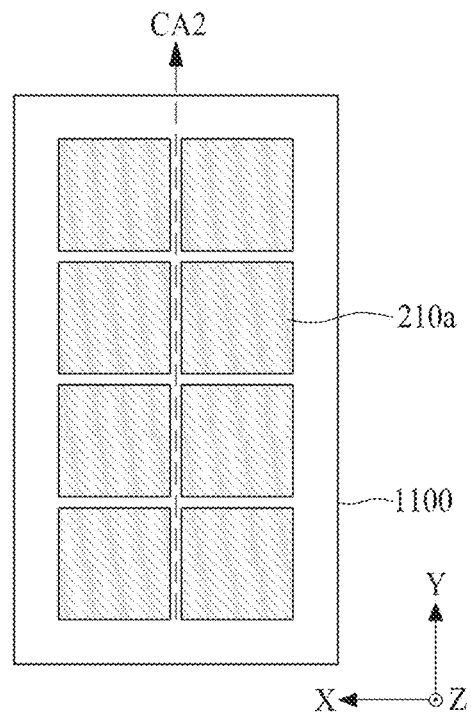

Next, as illustrated in FIG. 22B, the stage 1100 may normally rotate by 90° (degrees) with respect to an original point, and then, a first-order second cutting region CA2 of a plurality of second cutting regions CA2 (e.g., cutting regions in a widthwise direction) previously set on the inorganic material mother substrate 210a may be aligned on the cutting path of the cutting apparatus. Subsequently, each of the plurality of inorganic material mother substrates 210a may be divided into two inorganic material mother substrates 210a in the widthwise direction by cutting the second cutting region CA2 of the inorganic material mother substrate 210a aligned on the cutting path through a second cutting process performed by the cutting apparatus and the rectilinear movement of the stage 1100. For example, the four inorganic material mother substrates 210a obtained through patterning based on the first cutting process may be separated (e.g., patterned) into eight inorganic material mother substrates 210a through one-part second cutting process.

Figure 22C:
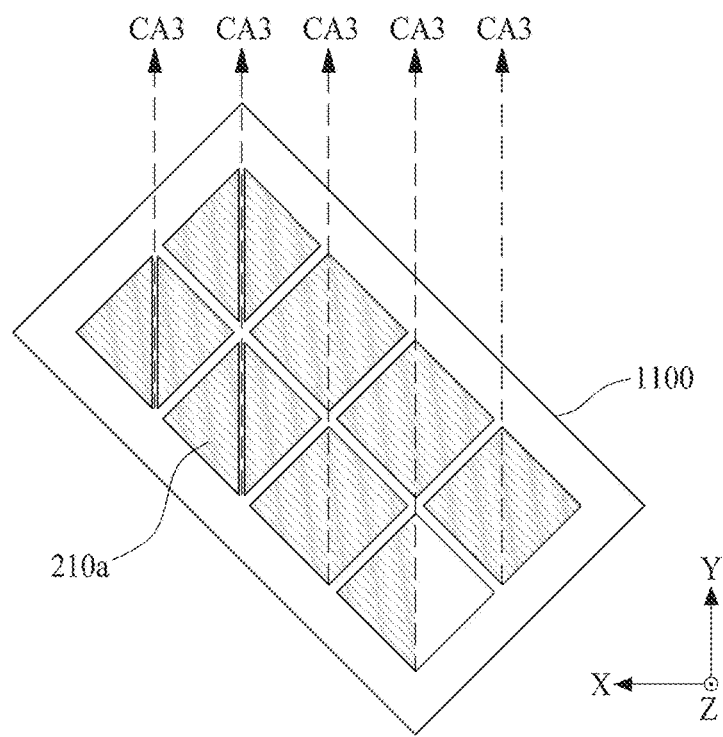

Next, as illustrated in FIG. 22C, the stage 1100 may normally rotate by 45° (degrees), and then, a first-order third cutting region CA3 of a plurality of third cutting regions CA3 (e.g., cutting regions in a first diagonal direction) previously set on the inorganic material mother substrate 210a may be aligned on the cutting path of the cutting apparatus. Next, each of the plurality of inorganic material mother substrates 210a may be divided into two inorganic material mother substrates 210a in the first diagonal direction by sequentially cutting each of the third cutting regions CA2 of the inorganic material mother substrate 210a aligned on the cutting path through a third cutting process performed by the cutting apparatus and the rectilinear movement of the stage 1100. For example, the eight inorganic material mother substrates 210a obtained through patterning based on the second cutting process may be separated (e.g., patterned) into sixteen inorganic material mother substrates 210a through five-part third cutting process.

Figure 22D:
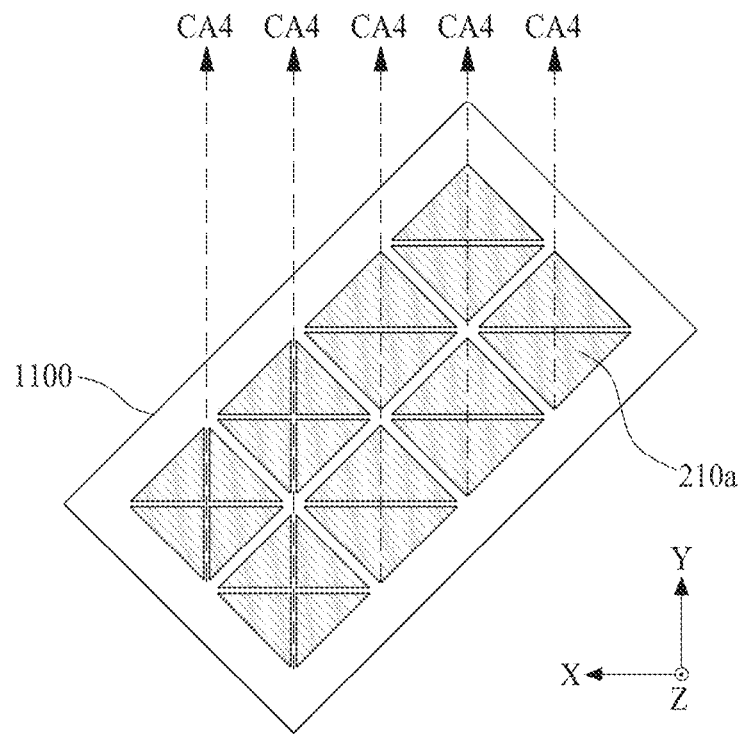

Next, as illustrated in FIG. 22D, the stage 1100 rotated by 135° (degrees) may reversely rotate by 90° (degrees) with respect to the original point, and then, a first-order fourth cutting region CA4 of a plurality of fourth cutting regions CA4 (e.g., cutting regions in a second diagonal direction) previously set on the inorganic material mother substrate 210a may be aligned on the cutting path of the cutting apparatus. Next, each of the plurality of inorganic material mother substrates 210a may be additionally divided into two inorganic material mother substrates 210a in the second diagonal direction by cutting each of the fourth cutting regions CA4 of the inorganic material mother substrate 210a aligned on the cutting path through a fourth cutting process performed by the cutting apparatus and the rectilinear movement of the stage 1100, thereby finally forming a plurality of inorganic material portions 210 having a triangular shape. For example, the sixteen inorganic material mother substrates 210a obtained through patterning based on the third cutting process may be separated (e.g., patterned) into thirty-two inorganic material portions 210 through five-part fourth cutting process. Four adjacent inorganic material portions 210 of the plurality of inorganic material portions 210 having the triangular shape may be disposed adjacent to one another to form a quadrilateral or tetragonal shape (e.g., a square shape), and vertices of the four adjacent inorganic material portions 210 may be disposed adjacent to one another in a center portion of the tetragonal shape.

In the cutting process performed on the inorganic material mother substrate 210a, the cutting regions CA1 to CA4 of the inorganic material mother substrate 210a may be aligned on the cutting path through the rotation and rectilinear movement of the stage 1100, based on the cutting regions CA1 to CA4 defined on the inorganic material mother substrate 210a and the cutting path of the cutting apparatus. By repeating a process of cutting the aligned cutting regions CA1 to CA4 of the inorganic material mother substrate 210a, the inorganic material mother substrate 210a may be finally separated (e.g., patterned) into a plurality of inorganic material portions 210 having a triangular shape. Therefore, a single inorganic material mother substrate 210a may be patterned into a plurality of inorganic material portions 210 through the first cutting process in the lengthwise direction, the second cutting process in the widthwise direction, the third cutting process in the first diagonal direction, and the fourth cutting process in the second diagonal direction. The cutting process performed on the inorganic material mother substrate 210a may form an inorganic material portion having various shapes, thereby enhancing a degree of design freedom in shape of an inorganic material portion.

Figure 22E:
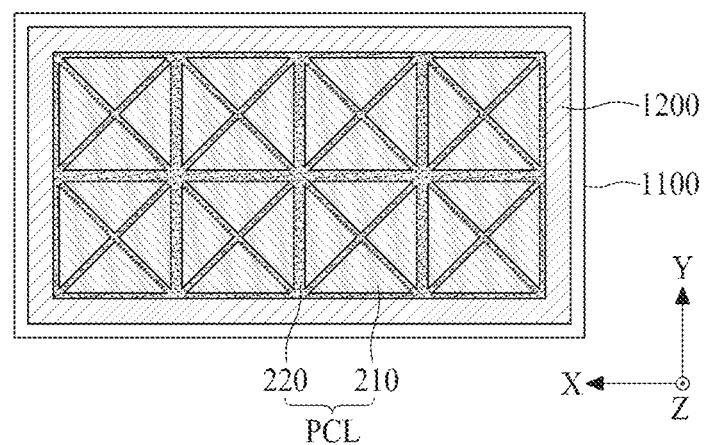

Next, as illustrated in FIG. 22E, a frame 1200 including an opening corresponding to a size of the flexible vibration module may be on the stage 1100, an organic material may be filled between two adjacent inorganic material portions of the plurality of inorganic material portions 210 and between each of the plurality of inorganic material portions 210 and the opening of the frame 1200, and organic material portions 220 having flexibility may be formed by curing the organic material through a curing process, thereby manufacturing a film type piezoelectric composite layer PCL including a plurality of inorganic material portions 210, each having a triangular shape and being spaced apart from one another, and an organic material portion 220 surrounding each of the plurality of inorganic material portions 210. Next, an organic material remaining on the film type piezoelectric composite layer PCL may be removed, and the film type piezoelectric composite layer PCL from which the organic material is removed may be unloaded from the frame 1200.

Figure 22F:
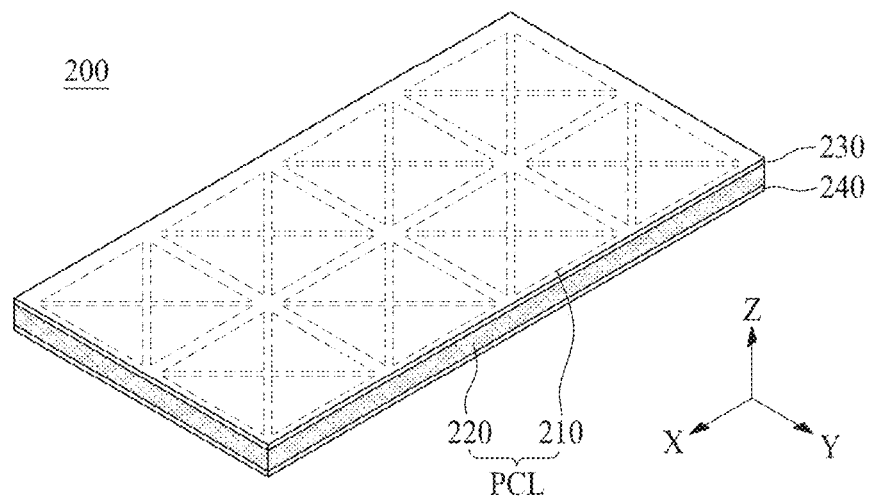

Next, as illustrated in FIG. 22F, a first electrode layer 230 may be formed on a first surface of the piezoelectric composite layer PCL, and a second electrode layer 240 may be formed on a second surface of the piezoelectric composite layer PCL, opposite to the first surface.

Next, polarization of each of the plurality of inorganic material portions 210 in the piezoelectric composite layer PCL may be formed through a polarization process of applying a certain voltage to the first electrode layer 230 and the second electrode layer 240 in a certain temperature atmosphere or a temperature atmosphere that may be changed from a high temperature to a room temperature. Next, a pad connected to each of the first electrode layer 230 and the second electrode layer 240 may be formed, and a protection film covering the first electrode layer 230 and the second electrode layer 240 may be formed, thereby completing the post-process performed on the flexible vibration module.

In another example, as illustrated in the FIG. 12 example, a cutting process of a single inorganic material mother substrate 210a may cut the single inorganic material mother substrate 210a. Thus, six adjacent inorganic material portions 210 having a triangular shape may be disposed in a hexagonal shape.

In the method of manufacturing the flexible vibration module according to another embodiment of the present disclosure, a single inorganic material mother substrate 210a may be patterned into a plurality of inorganic material portions 210 having a triangular shape by using a cutting process and rotation of the stage 1100. Thus, an inorganic material portion having various shapes may be formed, thereby enhancing a degree of design freedom in shape of an inorganic material portion.

Figure 23:
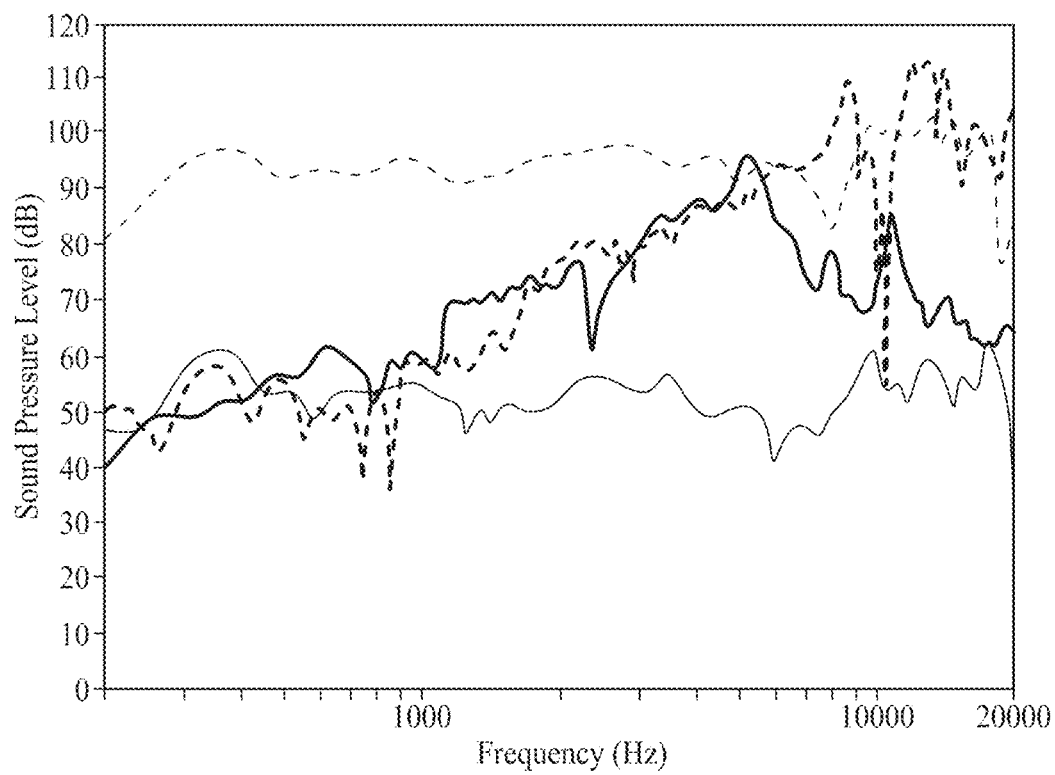
FIG. 23 is a graph showing experimental results of a sound pressure characteristic based on the presence of a display panel with respect to a flexible vibration module provided according to a first embodiment and a film speaker provided according to a comparative example.

FIG. 23 is a graph showing experimental results of a sound pressure characteristic based on the presence of a display panel with a flexible vibration module provided according to a first embodiment and a film speaker provided according to a comparative example.

In the sound pressure measurement of FIG. 23, Audio Precision company's APx525 was used, a sine sweep was applied at 200 Hz to 20 kHz, and sound pressure was measured at a position spaced apart from a display panel, a flexible vibration module, and a film speaker by 1 cm. The sine sweep may be a process of performing a sweep for a short time, but a process is not limited thereto. In FIG. 23, the abscissa axis (x-axis) represents a frequency in hertz (Hz), and the ordinate axis (y-axis) represents a sound pressure level in decibels (dB).

In the flexible vibration module of the first embodiment, a PZT inorganic material portion and a PVDF organic material portion, each having a pattern interval of 10 mm, were formed and prepared, a top electrode and a bottom electrode were formed and prepared, and V30 OLED display panel manufactured by LG Electronics was used. Also, the flexible vibration module prepared according to the first embodiment was attached to a display panel by a double-sided adhesive.

In the film speaker of the comparative example, Fils company's CS-510 was prepared. A PVDF organic piezoelectric layer was formed, and a mesh type electrode was formed on and under the PVDF organic piezoelectric layer, thereby manufacturing CS-510 film speaker. For example, the electrode may include poly(3,4-ethylenedioxythiophene) (PEDOT) and carbon nanotube (CNT), but embodiments are not limited thereto. Also, the film speaker was attached to the OLED display panel of the first embodiment by using a double-sided adhesive.

With reference to FIG. 23, before a flexible vibration module was attached to a display panel, comparing with the flexible vibration module prepared according to the first embodiment of the present disclosure (shown as a thick dotted line), it may be seen that the film speaker prepared according to the comparative example (shown as a thick solid line) outputs a good sound pressure level in a high sound band. However, after the flexible vibration module was attached to the OLED display panel, comparing with a display apparatus of the comparative example (shown as a thin solid line), it may be seen that a display apparatus prepared according to the first embodiment of the present disclosure (shown as a thin dotted line) outputs a sound pressure level of about 15 dB to about 20 dB higher in all of an audible frequency band. The audible frequency band may be, for example, 20 Hz to 20 kHz, but a range thereof is not limited thereto.

Therefore, when a display apparatus including the flexible vibration module according to an embodiment of the present disclosure is on a rear surface of a display panel and vibrates the display panel to output a sound to a forward region in front of the display panel, it may be seen by experimental results that performance of the display apparatus including the flexible vibration module according to an embodiment of the present disclosure is better than the film speaker of the comparative example. Also, when the film speaker of the comparative example is applied to a display apparatus, it may be seen that the film speaker of the comparative example is unable to implement a display apparatus that outputs a desired sound.

Figure 24:
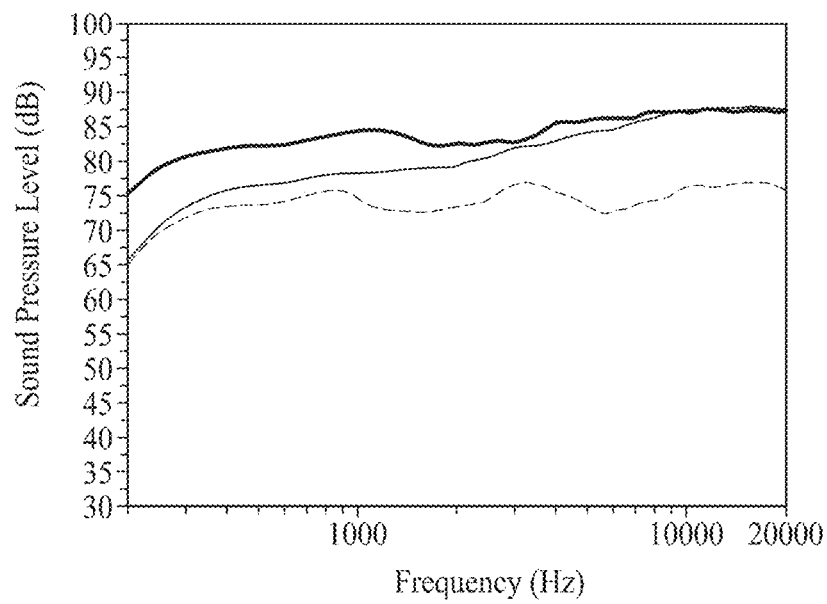
FIG. 24 is a graph showing experimental results of a sound pressure characteristic of an organic light-emitting diode display panel on which the flexible vibration modules according to the first to third embodiments of the present disclosure are attached.

FIG. 24 is a graph showing experimental results of a sound pressure characteristic of an organic light-emitting diode display panel to which the flexible vibration modules, according to the first to third embodiments of the present disclosure, are attached.

In the sound pressure measurement of FIG. 24, Audio Precision company's APx525 was used, a sine sweep was applied at 200 Hz to 20 kHz, and sound pressure was measured at a position spaced apart from a display panel, a flexible vibration module, and a film speaker by 1 cm. In FIG. 24, the abscissa axis (x-axis) represents a frequency in Hertz (Hz), and the ordinate axis (y-axis) represents a sound pressure level in decibels (dB).

As shown in FIG. 24, comparing with a display panel to which the flexible vibration module, according to the first embodiment of the present disclosure illustrated in FIG. 4, was attached (shown as a dotted line), it may be seen that a display panel to which the flexible vibration module according to the second embodiment of the present disclosure illustrated in FIG. 6 was attached (shown as a thin solid line), outputs a good sound pressure level in a high-pitched sound band. Also, comparing with a display panel on which the flexible vibration module, according to the first embodiment of the present disclosure, was attached (shown as the dotted line), it may be seen that a display panel to which the flexible vibration module according to the third embodiment of the present disclosure illustrated in FIG. 7 was attached (shown as a thick solid line), outputs a sound pressure level in a low-pitched sound band, as well as in the high-pitched sound band, and outputs a sound pressure level of about 10 dB higher in all of the audible frequency band. Also, comparing with the display panel to which the flexible vibration module according to the second embodiment of the present disclosure was attached (shown as the thin solid line), it may be seen that the display panel to which the flexible vibration module according to the third embodiment of the present disclosure illustrated in FIG. 7 was attached (shown as the thick solid line), outputs a sound pressure level of about 5 dB to about 10 dB higher in a middle-low-pitched sound band.

Therefore, in the flexible vibration module according to the present disclosure, it may be seen by experimental results that, when a size of an inorganic material portion increases as compared to a content of the same inorganic material portion, a sound pressure characteristic of the high-pitched sound band sound was improved, and it may be seen that, when a size of each of an organic material portion and an inorganic material portion increases compared to a content of the same inorganic material portion, a sound pressure characteristic was improved in all of the audible frequency. Accordingly, in a display apparatus including the flexible vibration module according to the present disclosure, a size of each of an organic material portion and an inorganic material portion may be adjusted based on a sound pressure characteristic of a sound band to be realized through a vibration of a display panel. Thus, it may be easy to realize a sound of a desired sound band according to an embodiment of the present disclosure.

Figure 25:
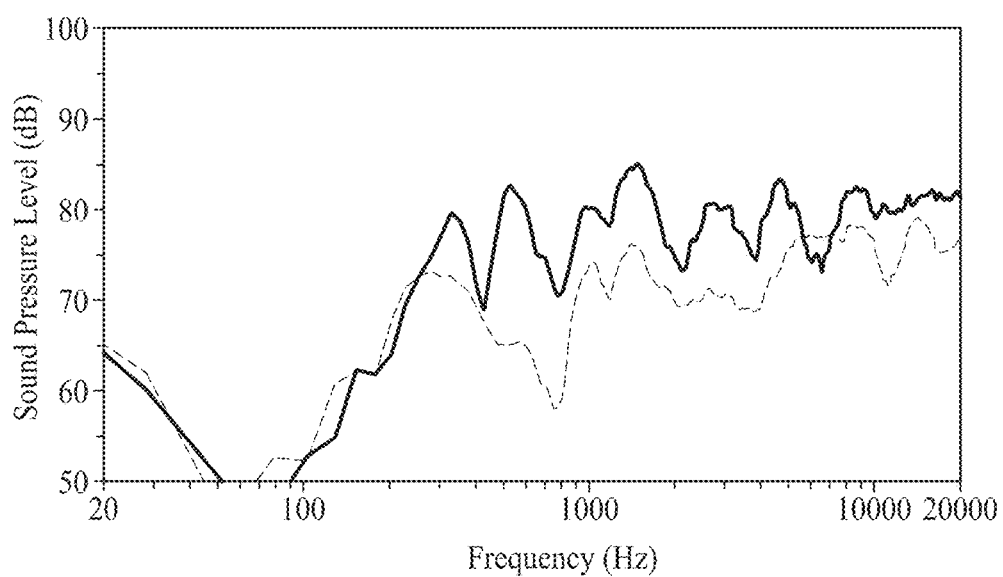
FIG. 25 is a graph showing experimental results of a sound pressure characteristic of an organic light-emitting diode display panel on which the flexible vibration modules according to the first to fourth embodiments of the present disclosure are attached.

FIG. 25 is a graph showing experimental results of a sound pressure characteristic of an organic light-emitting diode display panel to which the flexible vibration modules, according to the first to fourth embodiments of the present disclosure, are attached.

In the sound pressure measurement of FIG. 25, Audio Precision company's APx525 was used, a sine sweep was applied at 200 Hz to 20 kHz, and sound pressure was measured at a position spaced apart from a display panel, a flexible vibration module, and a film speaker by 1 cm. In FIG. 25, the abscissa axis (x-axis) represents a frequency in Hertz (Hz), and the ordinate axis (y-axis) represents a sound pressure level in decibels (dB).

As shown in FIG. 25, comparing with the flexible vibration module according to the first embodiment of the present disclosure illustrated in FIG. 4 (shown as a dotted line), it may be seen that the flexible vibration module according to the fourth embodiment of the present disclosure illustrated in FIG. 8 (shown as a solid line) outputs a sound pressure level in a sound band of 300 Hz or more, and solves a problem where dipping of a sound pressure occurs in about 300 Hz to about 1 kHz, thereby improving flatness of a sound pressure level. Therefore, it may be seen from experimental results that a curved display apparatus to which the flexible vibration module according to the fourth embodiment of the present disclosure is applied realizes a flat sound pressure characteristic and a high sound pressure level in a sound band of 300 Hz or more due to an organic material portion that has a wide size (e.g., width) in a region on which stress concentrates and has a narrow size (e.g., width) in a region where stress is reduced or minimized.

The flexible vibration module according to an embodiment of the present disclosure may be applied as a sound generating device provided in a display apparatus. The display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic notebooks, electronic books, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, televisions (TVs), wall paper display apparatuses, signage apparatuses, game machines, notebook computers, monitors, cameras, camcorders, home appliances, etc. Also, the flexible vibration module according to an embodiment of the present disclosure may be applied to organic light-emitting lighting apparatuses or inorganic light-emitting lighting apparatuses. When the flexible vibration module according to the present disclosure is applied to a lighting apparatus, the flexible vibration module may act as lighting and a speaker. Also, when the flexible vibration module according to the present disclosure is applied to a mobile apparatus, the flexible vibration module may act as a speaker or a receiver.

A display apparatus including a flexible vibration module and a method of manufacturing the flexible vibration module according to the present disclosure will be described below.

According to an embodiment of the present disclosure, a display apparatus may include: a display panel configured to display an image, and a flexible vibration module on a rear surface of the display panel, the flexible vibration module configured to vibrate the display panel, the flexible vibration module including: a plurality of first portions having a piezoelectric characteristic, and a plurality of second portions respectively between pairs of the plurality of first portions, the plurality of second portions having flexibility.

For example, in the display apparatus according to an embodiment of the present disclosure, each of the plurality of first portions may include an inflexible inorganic material, and each of the plurality of second portions may include a flexible organic material. For example, in the display apparatus according to an embodiment of the present disclosure, each of the plurality of second portions may include at least one of: an organic piezoelectric material and an organic non-piezoelectric material. For example, in the display apparatus according to an embodiment of the present disclosure, the flexible organic material may be configured to absorb an impact applied to the flexible vibration module or to the display apparatus.

For example, in the display apparatus according to an embodiment of the present disclosure, the plurality of first portions and the plurality of second portions may be in parallel on a same plane, and a size of each of the plurality of first portions may be the same as or different from a size of each of the plurality of second portions. For example, in the display apparatus according to an embodiment of the present disclosure, each of the plurality of first portions may have one of: a line shape, a circular shape, an oval shape, a triangular shape, and a polygonal shape.

For example, in the display apparatus according to an embodiment of the present disclosure, the plurality of first portions and the plurality of second portions may be in parallel on a same plane, and a size of each successive one of the plurality of second portions decreases in comparison with a previous one of the plurality of second portions in a direction from a center portion to a periphery portion of the flexible vibration module. For example, in the display apparatus according to an embodiment of the present disclosure, a second portion, having a largest size, among the plurality of second portions, may be in the center portion of the flexible vibration module. For example, in the display apparatus according to an embodiment of the present disclosure, each of the plurality of first portions may have a triangular shape and may be adjacent to another of the plurality of first portions to form a 2N-angular shape, where N may be a natural number greater than or equal to 2.

For example, in the display apparatus according to an embodiment of the present disclosure, the flexible vibration module may include: a first piezoelectric composite layer including a first group of the plurality of first portions and the plurality of second portions, a common electrode on the first piezoelectric composite layer, and a second piezoelectric composite layer on the common electrode, the second piezoelectric composite layer including a second group of the plurality of first portions and the plurality of second portions. For example, in the display apparatus according to an embodiment of the present disclosure, each of the plurality of first portions on the second piezoelectric composite layer: may respectively overlap a corresponding one of the plurality of second portions on the first piezoelectric composite layer, or may respectively overlap a corresponding one of the plurality of first portions on the first piezoelectric composite layer. For example, in the display apparatus according to an embodiment of the present disclosure, the display panel may include: a display area configured to display the image, and a non-display area surrounding the display area, and a size of the flexible vibration module may be 0.9 to 1.1 times a size of the display area.

For example, in the display apparatus according to an embodiment of the present disclosure, the display panel may include a display area configured to display the image, and the flexible vibration module may include: a first vibration module in a first region of the display area, the first vibration module including a first group of the plurality of first portions and the plurality of second portions, and a second vibration module in a second region of the display area, the second vibration module including a second group of the plurality of first portions and the plurality of second portions. For example, in the display apparatus according to an embodiment of the present disclosure, the flexible vibration module further may include: a third vibration module disposed alternately with respect to the first vibration module in the first region of the display area, the third vibration module including a third group of the plurality of first portions and the plurality of second portions, and a fourth vibration module disposed alternately with respect to the second vibration module in the second region of the display area, the fourth vibration module including a fourth group of the plurality of first portions and the plurality of second portions. For example, the display apparatus according to an embodiment of the present disclosure may further include a first plate between the third vibration module and the display panel, and a second plate between the fourth vibration module and the display panel. For example, in the display apparatus according to an embodiment of the present disclosure, each of the plurality of first portions may have a triangular shape and may be disposed adjacent to another of the plurality of first portions to form a 2N-angular shape, where N may be a natural number greater than or equal to 2.

For example, the display apparatus according to an embodiment of the present disclosure may further include another flexible vibration module on the rear surface of the display panel, the another flexible vibration module configured to vibrate the display panel, the display panel may include: a first region, a second region, and a partition configured to divide the first region and the second region, the flexible vibration module may be in the first region, and the another flexible vibration module may be in the second region. For example, the display apparatus according to an embodiment of the present disclosure may further include a third flexible vibration module and a fourth flexible vibration module on the rear surface of the display panel, each of the third flexible vibration module and the fourth flexible vibration module configured to vibrate the display panel, the third flexible vibration module may be in the first region and may be diagonally disposed with respect to the first flexible vibration module, and the fourth flexible vibration module may be in the second region and may be diagonally disposed with respect to the second flexible vibration module.

According to an embodiment of the present disclosure, a display apparatus may include: a flexible display panel capable of being wound in a spiral shape, unwound, or at a certain curvature radius, the flexible display panel including a display area configured to display an image, and a flexible vibration module on a rear surface of the flexible display panel to correspond to the display area and bent based on unwinding or winding of the flexible display panel or bent based on a curvature of the flexible display panel, the flexible vibration module including: a plurality of vibration portions, and a plurality of elastic portions respectively between pairs of the plurality of vibration portions, the plurality of elastic portions having flexibility.

For example, in the display apparatus according to an embodiment of the present disclosure, each of the plurality of vibration portions may include an inflexible inorganic material having the piezoelectric characteristic, and each of the plurality of elastic portions may include a flexible material including at least one of: an organic piezoelectric material and an organic non-piezoelectric material. For example, in the display apparatus according to an embodiment of the present disclosure, the flexible material may be configured to absorb an impact applied to the flexible vibration module or to the display apparatus. For example, in the display apparatus according to an embodiment of the present disclosure, the plurality of vibration portions and the plurality of elastic portions may be in parallel on a same plane, and a size of each of the plurality of vibration portions may be the same as or different from a size of each of the plurality of elastic portions.

For example, the display apparatus according to an embodiment of the present disclosure may further include another flexible vibration module on the rear surface of the flexible display panel to correspond to the display area and bent based on unwinding or winding of the flexible display panel or bent based on a curvature of the flexible display panel, the flexible display panel may include: a first region, a second region, and a partition configured to divide the first region and the second region, the flexible vibration module may be in the first region, and the another flexible vibration module may be in the second region. For example, the display apparatus according to an embodiment of the present disclosure may further include a third flexible vibration module and a fourth flexible vibration module on the rear surface of the display panel to correspond to the display area and bent based on unwinding or winding of the flexible display panel or bent based on a curvature of the flexible display panel, the third flexible vibration module may be in the first region and may be diagonally disposed with respect to the first flexible vibration module, and the fourth flexible vibration module may be in the second region and may be diagonally disposed with respect to the second flexible vibration module.

According to an embodiment of the present disclosure, a method of manufacturing a flexible vibration module may include: manufacturing a piezoelectric composite including a plurality of inorganic material portions and a plurality of organic material portions connected between the plurality of inorganic material portions, based on an inorganic material mother substrate having a piezoelectric characteristic and an organic material having flexibility, forming a first electrode layer on a first surface of the piezoelectric composite and a second electrode layer on a second surface of the piezoelectric composite, applying a voltage to the first electrode layer and the second electrode layer to form polarization of each of the plurality of inorganic material portions in a temperature atmosphere, and forming a protection film on each of the first electrode layer and the second electrode layer.

For example, in the method according to an embodiment of the present disclosure, each of the plurality of inorganic material portions may have a triangular shape and may be adjacent to another of the plurality of inorganic material portions to form a 2N-angular shape, where N may be a natural number greater than or equal to 2. For example, in the method according to an embodiment of the present disclosure, the manufacturing of the piezoelectric composite may include: manufacturing a stacked composite by repeating: a process of forming a flexible organic material layer on the inorganic material mother substrate, and a process of stacking another inorganic material mother substrate on the organic material layer, curing the organic material layer stacked on the stacked composite, and cutting the stacked composite by a certain size to manufacturing the piezoelectric composite having a film type, and each inorganic material mother substrate may include an inflexible material.

For example, in the method according to an embodiment of the present disclosure, the manufacturing of the piezoelectric composite may include: placing the inorganic material mother substrate on a rotatable stage, based on a plurality of cutting regions defined in the inorganic material mother substrate and a cutting path of a cutting apparatus, aligning the cutting regions of the inorganic material mother substrate and the cutting path of the cutting apparatus through rotation and rectilinear movement of the rotatable stage and patterning the inorganic material mother substrate into the plurality of inorganic material portions through a cutting process of sequentially cutting the aligned cutting regions of the inorganic material mother substrate, placing the frame including the opening on the rotatable stage, and filling and curing an organic material between the plurality of inorganic material portions and between each of the plurality of inorganic material portions and the opening of the frame to form the plurality of organic material portions. For example, in the method according to an embodiment of the present disclosure, the plurality of cutting regions may include: a plurality of lengthwise-direction cutting regions, a widthwise-direction cutting region, a plurality of first-diagonal-direction cutting regions, and a plurality of second-diagonal-direction cutting regions, and the cutting process may include: a first cutting process of cutting each of the plurality of lengthwise-direction cutting regions, a second cutting process of cutting the widthwise-direction cutting region, a third cutting process of cutting each of the plurality of first-diagonal-direction cutting regions, and a fourth cutting process of cutting each of the plurality of second-diagonal-direction cutting regions.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A film actuator, comprising:
   a plurality of vibration portions configured to be parallel to each other; and
   a plurality of flexible portions respectively between the plurality of vibration portions,
   wherein each of the plurality of vibration portions comprises an inflexible inorganic material having a piezoelectric characteristic, and
   wherein each of the plurality of flexible portions comprises an organic material comprising at least one of an organic piezoelectric material and an organic non-piezoelectric material.

2. The film actuator of claim 1, wherein each of the plurality of flexible portions is configured to have at least one of a modulus and viscoelasticity lower than each of the plurality of vibration portions.

3. The film actuator of claim 1, wherein each of the plurality of flexible portions is configured to fill between the plurality of vibration portions.

4. The film actuator of claim 1, wherein:
   the plurality of vibration portions and the plurality of flexible portions are in parallel on a same plane; and
   a size of each of the plurality of vibration portions is the same as or different from a size of each of the plurality of flexible portions.

5. The film actuator of claim 1, wherein each of the plurality of vibration portions has one of: a line shape, a circular shape, an oval shape, a triangular shape, and a polygonal shape.

6. The film actuator of claim 1, wherein:
the plurality of vibration portions and the plurality of flexible portions are in parallel on a same plane; and
a size of each successive one of the plurality of flexible portions decreases in comparison with a previous one of the plurality of flexible portions in a direction from a center portion to a periphery portion of the film actuator.

7. The film actuator of claim 6, wherein a flexible portion having a largest size among the plurality of flexible portions, is at the center portion of the film actuator.

8. The film actuator of claim 1, wherein the film actuator comprises:
a first composite layer comprising a first of the plurality of vibration portions and a first of the plurality of flexible portions;
a second composite layer comprising a second of the plurality of vibration portions and a second of the plurality of flexible portions; and
a common electrode between the first composite layer and the second composite layer.

9. The film actuator of claim 8, wherein each of the plurality of vibration portions of the second composite layer:
respectively overlaps a corresponding one of the plurality of flexible portions of the first composite layer; or
respectively overlaps a corresponding one of the plurality of vibration portions of the first composite layer.

10. A film actuator, comprising:
a piezoelectric composite layer configured to vibrate in a vertical direction;
a first electrode layer in contact with a whole first surface of the piezoelectric composite layer; and
a second electrode layer in contact with a whole second surface of the piezoelectric composite layer different from the first surface of the piezoelectric composite layer.

11. The film actuator of claim 10, wherein the piezoelectric composite layer is configured to be bent in a curved shape.

12. The film actuator of claim 10, wherein the piezoelectric composite layer comprises:
a plurality of vibration portions configured to be parallel to each other; and
a plurality of flexible portions between the plurality of vibration portions,
wherein the first electrode layer contacts a first surface of each of the plurality of vibration portions and a first surface of each of the plurality of flexible portions, and
wherein the second electrode layer contacts a second surface of each of the plurality of vibration portions and a second surface of each of the plurality of flexible portions.

13. The film actuator of claim 12, wherein each of the plurality of vibration portions comprises an inflexible inorganic material having a piezoelectric characteristic, and
wherein each of the plurality of flexible portions comprises an organic material comprising at least one of an organic piezoelectric material and an organic non-piezoelectric material.

14. The film actuator of claim 11, wherein the piezoelectric composite layer further comprises:
a first protection film on the first electrode layer; and
a second protection film on the second electrode layer.

15. The film actuator of claim 10, wherein the piezoelectric composite layer comprises:
a plurality of vibration portions configured to be parallel to each other; and
a flexible portion between the plurality of vibration portions,
wherein the first electrode layer contacts a first surface of each of the plurality of vibration portions and a first surface of the flexible portion, and
wherein the second electrode layer contacts a second surface of each of the plurality of vibration portions and a second surface of the flexible portion.

16. The film actuator of claim 15, wherein the flexible portion is configured to fill between the plurality of vibration portions.

17. The film actuator of claim 15, wherein each of the plurality of vibration portions has one of a line shape, a circular shape, an oval shape, a triangular shape, and a polygonal shape.

18. The film actuator of claim 15, wherein the flexible portion surrounds a side surface of each of the plurality of vibration portions.

19. The film actuator of claim 18, wherein each of the plurality of vibration portions has one of a circular shape, an oval shape, a triangular shape, and a polygonal shape.

20. The film actuator of claim 18, wherein each of the plurality of vibration portions has a triangular shape and is adjacent to another of the plurality of vibration portions to form a 2N-angular shape, where N is a natural number greater than or equal to 2.

21. A display apparatus, comprising:
a display panel configured to display an image; and
a flexible vibration module on a rear surface of the display panel, the flexible vibration module configured to vibrate the display panel,
wherein the flexible vibration module is configured to include the film actuator of claim 1.

22. The display apparatus of claim 21, further comprising:
a rear structure on the rear surface of the display panel; and
a gap space between the flexible vibration module and the rear structure.

23. A display apparatus, comprising:
a flexible display panel configured to display an image; and
a flexible vibration module on a rear surface of the flexible display panel, the flexible vibration module configured to vibrate the flexible display panel,
wherein the flexible vibration module is configured to include the film actuator of claim 10.

24. The display apparatus of claim 23, further comprising a plate between one of the flexible vibration module and the flexible display panel.

25. The display apparatus of claim 24, wherein the plate comprises a material including one or more of stainless steel, Al, a Mg alloy, a Mg—Li alloy, and an Al alloy.

* * * * *